(12) United States Patent
Webb

(10) Patent No.: US 10,160,634 B2
(45) Date of Patent: Dec. 25, 2018

(54) SMALL WAFER ARE MEMS SWITCH

(71) Applicant: INTERNATIONAL BUSINESS MACHINES CORPORATION, Armonk, NY (US)

(72) Inventor: Bucknell C. Webb, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/650,953

(22) Filed: Jul. 16, 2017

(65) Prior Publication Data

US 2017/0341931 A1    Nov. 30, 2017

Related U.S. Application Data

(63) Continuation of application No. 14/969,329, filed on Dec. 15, 2015, now Pat. No. 9,758,366.

(51) Int. Cl.
| | | |
|---|---|---|
| *B81B 3/00* | (2006.01) | |
| *B81C 1/00* | (2006.01) | |
| *B81B 5/00* | (2006.01) | |
| *B81C 3/00* | (2006.01) | |

(52) U.S. Cl.
CPC ........ *B81B 3/0056* (2013.01); *B81C 1/00619* (2013.01); *B81B 2201/012* (2013.01); *B81B 2203/0118* (2013.01); *B81B 2203/0315* (2013.01); *B81B 2203/04* (2013.01); *B81B 2207/07* (2013.01); *B81C 2201/0132* (2013.01); *B81C 2201/0178* (2013.01)

(58) Field of Classification Search
CPC ........................ B81C 1/00619; B81B 3/0056
See application file for complete search history.

(56) References Cited

U.S. PATENT DOCUMENTS

| | | |
|---|---|---|
| 6,426,687 B1 | 7/2002 | Osborn |
| 6,535,091 B2 | 3/2003 | Bechtle et al. |
| 6,798,315 B2 | 9/2004 | Schaefer |
| 6,880,235 B2 | 4/2005 | Ma |
| 6,962,832 B2 | 11/2005 | Chou |
| 6,995,440 B2 | 2/2006 | Ma |
| 7,119,943 B2 | 10/2006 | Nelson et al. |
| 7,190,245 B2 | 3/2007 | Receveur et al. |
| 7,253,709 B1 | 8/2007 | Chang et al. |
| 7,283,024 B2 | 10/2007 | Bar et al. |
| 2003/0085109 A1 | 5/2003 | Ma |
| 2003/0132824 A1 | 7/2003 | Ma |
| 2004/0216989 A1 | 11/2004 | Ma |
| 2005/0104694 A1 | 5/2005 | Cho et al. |
| 2006/0050360 A1 | 3/2006 | Nelson et al. |
| 2007/0018760 A1 | 1/2007 | Jeong et al. |

(Continued)

*Primary Examiner* — Moazzam Hossain
*Assistant Examiner* — Long H Le
(74) *Attorney, Agent, or Firm* — Thomas A. Beck; Daniel P. Morris

(57) ABSTRACT

Deep via technology is used to construct an integrated silicon cantilever and cavity oriented in a vertical plane which creates an electrostatically-switched MEMS switch in a small wafer area. Another embodiment is a small wafer area electrostatically-switched, vertical-cantilever MEMS switch wherein the switch cavity is etched within a volume defined by walls grown internally within a silicon substrate using through vias.

9 Claims, 13 Drawing Sheets

(56) References Cited

U.S. PATENT DOCUMENTS

| | | |
|---|---|---|
| 2007/0024390 A1 | 2/2007 | Hong et al. |
| 2007/0024401 A1 | 2/2007 | Kim et al. |
| 2007/0024403 A1 | 2/2007 | Kwon et al. |
| 2007/0030104 A1 | 2/2007 | Chou |
| 2007/0092180 A1 | 4/2007 | Hashimura et al. |
| 2007/0170460 A1 | 7/2007 | Lee et al. |
| 2007/0205087 A1 | 9/2007 | Pashby et al. |
| 2008/0001691 A1 | 1/2008 | Hong et al. |
| 2008/0006850 A1 | 1/2008 | Ribnicek |
| 2008/0014663 A1 | 1/2008 | Hsu et al. |
| 2010/0263998 A1 | 10/2010 | Anderson |
| 2011/0031633 A1 | 2/2011 | Hsu |
| 2012/0138436 A1 | 6/2012 | Gambino |
| 2013/0015743 A1 | 1/2013 | Tsai |
| 2015/0041927 A1* | 2/2015 | Geisberger ............ B81B 3/0027 257/415 |
| 2015/0102437 A1* | 4/2015 | Liu ....................... B81B 3/0021 257/419 |
| 2016/0172112 A1 | 6/2016 | Knipe |
| 2016/0318758 A1* | 11/2016 | Chou .................. B81C 1/00619 |

* cited by examiner

Section A - A

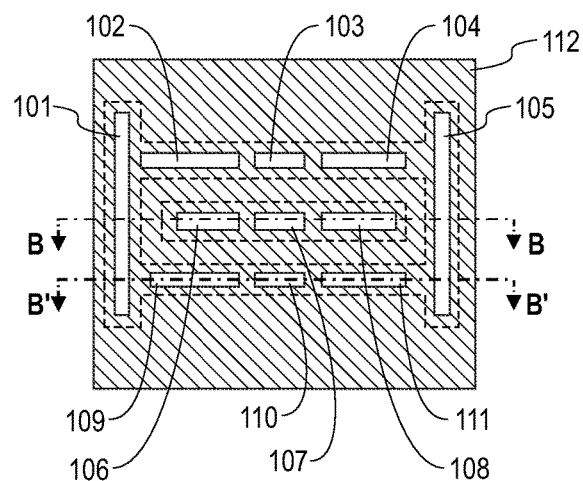
FIG. 17
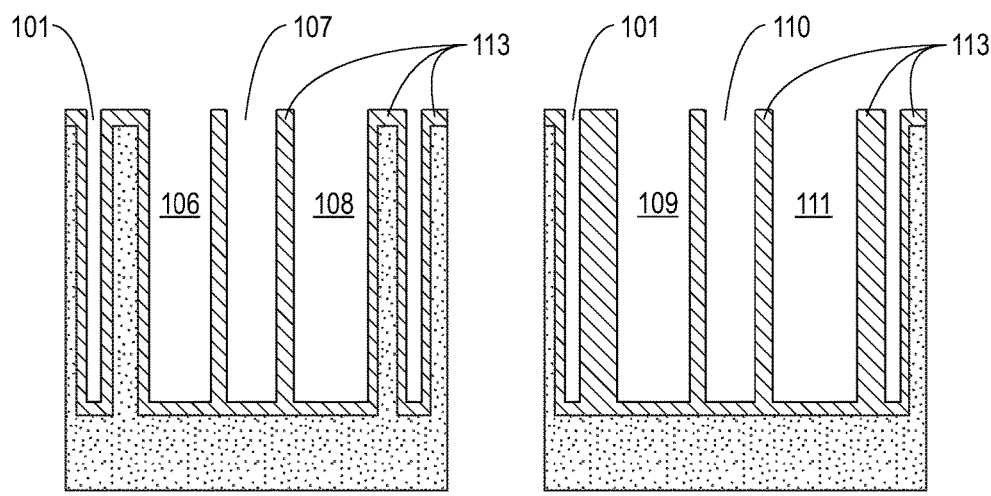
FIG. 18
Section B - B
FIG. 19
Section B' - B'

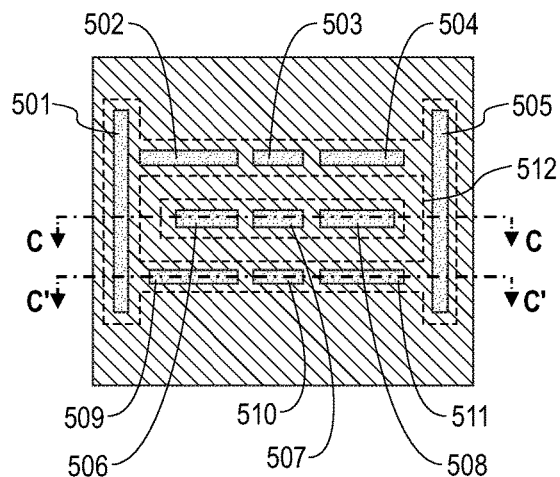
FIG. 20
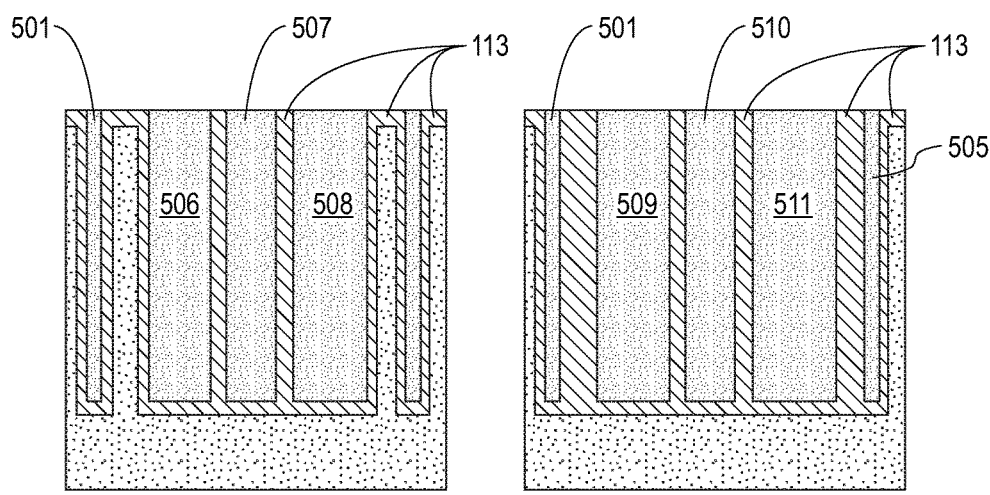
FIG. 21
Section C - C
FIG. 22
Section C' - C'

Section D - D

Section D - D'

Section E - E'

SMALL WAFER ARE MEMS SWITCH

FIELD OF THE INVENTION

The present invention relates to silicon integrated miniature micromechanical-electronic switches (MEMS) designed for R.F. receiver/transmitter systems especially for antenna and transmit/receive selection.

DESCRIPTION OF THE PRIOR ART

MicroElectroMechanical Systems (MEMS) are the integration of mechanical elements, sensors, actuators and electronics on a common substrate using integrated circuit process sequences. The electronics are fabricated using standard IC.

More specifically, MEMS switches are surface-micromachined devices which use a mechanical movement to achieve a short circuit or an open circuit in a RF transmission-line. RF MEMS switches are specific micromechanical switches which are designed to operate at RF to mm-wave frequencies (0.1 to 100 GHz). The actuation forces required for the mechanical movement can be obtained using electrostatic, magneto-static, piezoelectric or thermal designs. The present invention is an electrostatic-type switch.

Silicon integrated MEMS switches are desired for RF receiver/transmitter systems especially for antenna and transmit/receive selection. The usual design requires a horizontal flexible silicon cantilever around 100 µm long. This uses a substantial wafer area, especially since RF chips are usually small. The proposed invention uses the deep via technology developed for the silicon wafer to turn the silicon integrated cantilever vertical and create a MEMS switch in a small wafer area.

Examples of conventional MEMS typically utilize cantilever switches, membrane switches, and tunable capacitor structures, and are described, e.g., in U.S. Pat. No. 6,160,230 to McMillan et al., U.S. Pat. No. 6,143,997 to Feng et al., U.S. Pat. No. 5,970,315 to Carley et al., and U.S. Pat. No. 5,880,921 to Tham et al.

MEMS devices are manufactured using micro-electromechanical techniques and are mainly used to control electrical, mechanical or optical signal flows. Such devices, however, present many problems because their structure and innate material properties require that they be manufactured in lines that are separate from conventional semiconductor manufacture processing. This is usually due to materials and processes which are incompatible and which cannot be integrated within existing semiconductor fabrication lines.

Implementing MEMS switches for semiconductor applications has many advantages, such as: (1) low insertion loss, (2) low or no DC power consumption, (3) high linearity, and (4) broad bandwidth performance.

However, the MEMS must be provided with a low actuation-voltage switch and must not suffer from stiction, that is, the inability to restore the switch to its original state when desired. An example of a MEMS found in the prior art requires a flexible silicon cantilever around 100 µm long, and typically requires 10 to 100 V operating voltage, which is unsuited for integration with state-of-the-art integrated circuits. This length is inefficient as it occupies a substantial wafer area, especially since RF chips are usually small. The proposed invention uses the deep via technology developed for the silicon chip to turn the silicon integrated cantilever vertical and create a MEMS switch in a small wafer area.

U.S. Pat. No. 6,143,997, to Feng at al., and in particular, to FIG. 1A illustrated therein, a prior art cantilever switch is shown in a resting position with the cantilever portion a distance $h_A$ away from an RF transmission line creating an off state, since the distance $h_A$ prevents current from flowing from the cantilever to the transmission line below it. To turn the switch on, as shown in FIG. 1B, a large switching voltage, typically in the order of 28 Volts, is necessary to overcome physical properties and bend the metal down to contact the RF transmission line. In the energized state, with the metal bent down, an electrical connection is created between the cantilever portion and the transmission line. Thus, the cantilever switch is on when it remains in the excited state.

Referring to Feng et al., FIGS. 2A-2B show a membrane switch, in both a resting and an energized position. When the membrane switch remains in its resting position, current is unable to flow from the membrane to an output pad and the switch is turned off. Similar to the cantilever switch, a high actuation voltage, typically 38 to 50 volts, is necessary to deform the metal and activate the switch. In the excited state, the membrane is deformed to contact a dielectric layer on the output pad, thereby electrically connecting the membrane to the output pad to turn the switch on. This design also requires a relatively high voltage.

Another type of MEMS switch is described by L. Frenzel, in the article *MEMS Switch Puts SoC Radios on the Cusp, Electronic Design*, p. 29, Jun. 9, 2003, that uses a combination of thermal and electrostatic actuation. These devices have been used for band and circuit reconfiguration in a multi-band/multi-mode RF system. In order to change the state of the switch, each time 20 mA current must be applied, which is not practical for a CMOS chip environment.

More MEMS switches are emerging for RF applications. For example, STMicroelectronics describes a combination of thermal and electrostatic actuation type MEMS switches for mode of operation and circuit configurations designed for multi-mode and multi-band RF system applications. Such switches also require 20 mA of current to heat the device and allow it to switch. High-currents of this magnitude are not suitable for CMOS applications. To date, conventional MEMS switches are not CMOS compatible because: (1) they are difficult to integrate using MOS process steps and, (2) they require a high-current and high actuation operation voltages.

The MEMS switches disclosed in the prior art have the cantilever and anchor aligned in a horizontal plane, whereas the MEMS switch of the present invention is a vertical electrostatically switched cantilever which is different from those discussed above and found in the prior art.

SUMMARY OF THE INVENTION

The present invention relates to a cantilever that is oriented vertically with the anchor at the bottom of a vertical cavity, making contacts at near the wafer surface. Deep via technology is used to construct an integrated silicon cantilever and cavity oriented in a vertical plane which creates an electrostatically-switched MEMS switch in a small wafer area.

One embodiment of the present invention uses the deep via technology developed for the silicon wafer to turn the silicon integrated cantilever to a vertical plane which creates a MEMS switch in a small wafer area. The MEMS switch is a vertical electrostatically switched cantilever. The overall cantilever and contact points are defined in an initial DRIE step and insulated with thermal oxide. The switch is than temporarily filled with polysilicon. The active circuits and if desired, some of the BEOL processing is done. DRIE is then used to open the switch areas where the contacts will go and seed metal deposited. The remaining polysilicon is then removed to eliminate seed bridging the switch gap. Electrodes are copper electroplated. The electrode(s) on the cantilever are configured to run down to the bottom of the etched cavity around the cantilever and up the cavity wall to the top. The width of the gap between cantilever and wall determines whether the plating extends all the way to the bottom of the cavity or stops somewhere on the walls. The electrodes will then need a corrosion resistant coating. Finally a resist layer can be used to support a lid deposited on top. Openings need to be left for the removal of the resist, which are afterward filled to leave a sealed cavity.

More specifically, the embodiment noted relates to a silicon wafer having a cavity etched therein. The cavity has a surrounding side wall surface, and a bottom, and contains within the cavity, a freestanding pillar, also referred to herein as a beam or a column, which is a cantilevered beam structure attached at said bottom of the cavity. The cantilevered beam structure has an electrically conductive outer layer thereon and functions ultimately as an deflection electrode. There is also a stationary flat electrode covered with a conductive layer, which is positioned adjacent to and in a plane parallel to the deflection electrode. At least one flat drive electrode covered with a conductive layer is positioned adjacent to and in a plane aligned parallel to both the deflection electrode and the stationary electrode.

There is a gap separating a contact point on the deflection electrode from a contact point on the stationary electrode. The contact point on the deflection electrode and the contact point on the stationary electrode are both covered with an insulation material.

The deflection electrode is configured to be electrostatically attracted toward the drive electrode with a cantilevered motion, when the drive electrode is electrically biased, with the result that the insulated contact point on the conductive layer of said deflection electrode contacts the insulated contact point on the conductive layer of said stationary electrode.

A second embodiment of the present invention is a small wafer area electrostatically-switched, vertical-cantilever MEMS switch wherein the switch cavity is etched within a volume defined by walls grown internally within a silicon substrate using through vias.

This alternative small wafer area embodiment switch comprises a silicon wafer having an upper and a lower surface with a plurality, preferably, three separate aligned DRIE closely spaced trenches having a high aspect ratio in a first row, in a second row and in a third row. Each of the etched trenches is lined with a thermal oxide and filled with a tungsten plug.

Further, each of the trenches in the first row, second row and third row is connected by a lining of thermal oxide wherein the thermal oxide surrounds each trench and blends together in the space between trenches.

The nine trenches initially etched into the silicon component are aligned to form a top appearance of a 3×3 matrix wherein there are three columns and three rows with three entries in each row and accordingly three entries in each column.

The first row of trenches with the thermal oxide connecting same together and the third row of trenches with the thermal oxide are connected together form an outer group. The second row of trenches with thermal oxide coating is located between first row of trenches and the third row of trenches and forms an inner group. All of the trenches mentioned in the first, second and third rows are filled with tungsten plugs. There is an area on the upper wafer surface that is not layered with the thermal oxide. A dielectric layer is deposited on the upper silicon wafer surface covering that area noted, between the inner group and the outer group that is not covered with thermal oxide. An area is etched out from the lower surface of and within the silicon wafer. The etched area is in vertical alignment with the inner group on the upper surface of the silicon wafer. After appropriate etching, the inner group, filled with tungsten, serves as a freestanding beam cantilevered at said dielectric layer. The etched out cantilevered beam structure is the deflection electrode of the MEMS switch. In addition, another tungsten plug is formed as a stationary flat electrode positioned adjacent to and in a plane parallel to the deflection electrode; and another tungsten plug is a drive electrode, positioned adjacent to and in a plane aligned parallel to the deflection electrode and the stationary electrode.

A gap is set to separate a contact point on the deflection electrode from a contact point on the stationary electrode. The contact point on the deflection electrode and the contact point on the stationary electrode are each covered with an insulation material.

In the manufacture of semiconductor devices, when the active elements of these semiconductor devices are constructed, a damascene structure in combination with the MEMS switch is used. The damascene structure comprises metal conductive layers above these active elements to complete the electrical interconnection inside the semiconductor devices.

The process for the manufacture of the metal conductive layers consist of forming a metal layer above the active regions of the semiconductor devices, proceeding with photoresist coating, developing, and etching to complete the manufacture of a first metal layer, then depositing a dielectric layer on the first metal layer, and finally proceeding with the manufacture of multiple metal layers dependent on the needs of the different semiconductor devices. The damascene structure of this embodiment is positioned below the MEMS switch and in contact with a supporting layer.

DESCRIPTION OF THE DRAWINGS

FIG. 17 is a top view of the exposed upper surface of the silicon wafer and the trenches having been subjected to a thermal oxide or CVD oxide coating.

FIG. 18 is aside view of the silicon wafer along the view B-B showing trenches and a layer of oxide coating covering the side walls forming the trenches.

FIG. 19 is a different side view of the silicon wafer along the view B'-B' showing trenches and a layer of oxide coating covering the side walls forming the trenches.

FIG. 20 is a top view of the wafer with etched and lined openings filled with W.

FIG. 21 is a side view of the silicon wafer along the view C-C showing trenches filled with W plugs and the layer of oxide coating covering the side walls forming the trenches.

FIG. 22 is a different side view of the silicon wafer along the view C'-C' showing trenches with W plugs and a layer of oxide coating coveting the side walls forming the trenches.

The accompanying drawings, which are incorporated in and constitute a part of the specification, illustrate presently preferred embodiments of the invention, and together with the general description given above and the detailed description of the preferred embodiments given below, serve to explain the principles of the invention.

DESCRIPTION OF THE PREFERRED EMBODIMENT

The proposed invention comprises two preferred embodiments. Each embodiment uses the deep via technology developed for the silicon wafer to turn the silicon integrated cantilever into an electrostatically switched cantilever and thus to create a MEMS switch in a small wafer area.

The MEMS switch of the present invention may be positioned on a supporting layer (not shown) which may be comprised of silicon dioxide ($SiO_2$), borophosphosilicate glass (BPSG), phosphosilicate glass (PSG), silicon nitride ($Si_3N_4$), silicon oxynitride (SiOxNy), or any other suitable dielectric.

In the process of making each of the two embodiments described above, i.e., with and without a dual damascene structure, copper is used as the metal conductor of the semiconductors.

Figure 1:
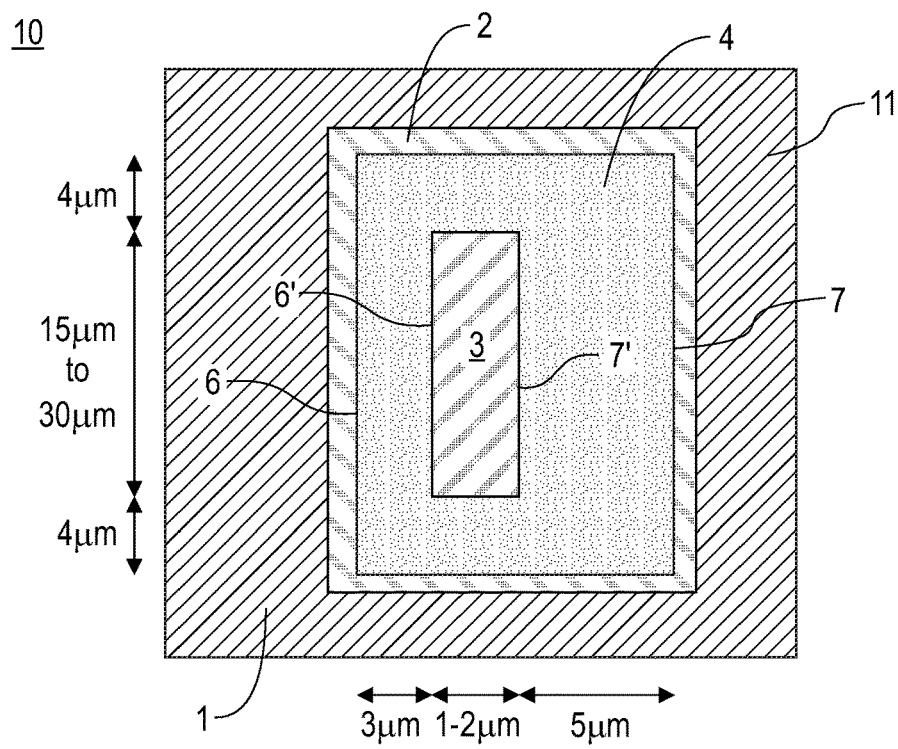
FIG. 1 is a top view of an initially processed silicon wafer.
Figure 2:
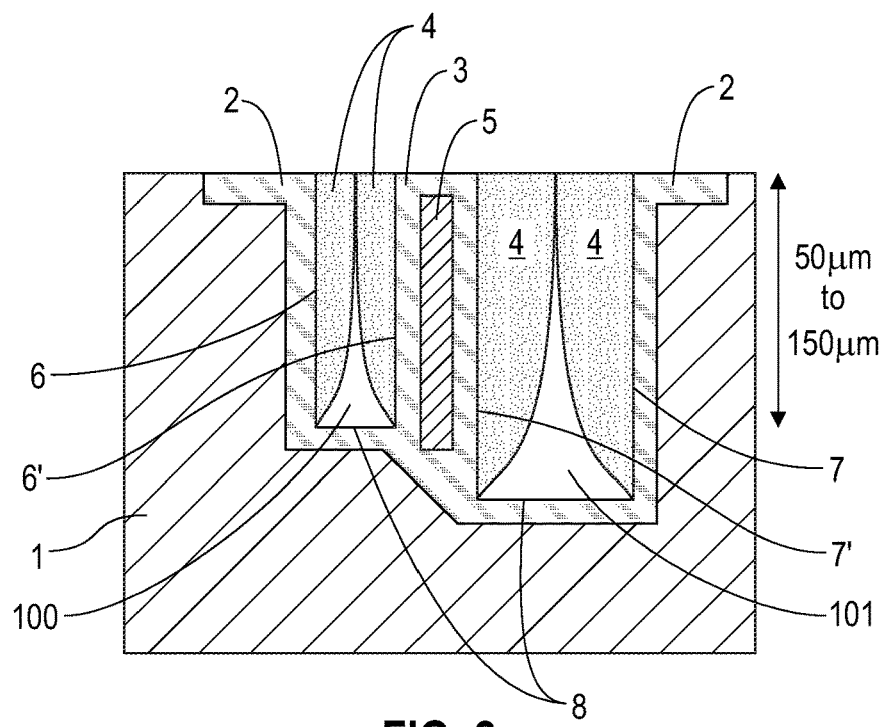
FIG. 2 is a side view of the switch depicted in FIG. 1.

As to the first embodiment, FIG. 1 and FIG. 2 show a top and a side view of the silicon wafer after the first sequence steps of the process for making the MEMS switch have been completed.

FIG. 1 is a top view of the initially processed silicon wafer 10 having a body 1. FIG. 2 depicts a side view of the top view of the switch depicted in FIG. 1. The silicon wafer body comprises $SiO_2$ which is first subjected to deep reactive-ion etching (DRIE).

The DRIE used, in accordance with the present invention is a highly anisotropic etch process developed for MEMS switches, designed to create deep penetration, thus forming steep-sided holes or trenches in substrates (also in wafers), typically with high aspect ratios.

The Bosch DRIE process was used to create the trench in the wafer body. The Bosch processes fabricate substantially 90° (truly vertical) walls. Bosch process can also be slightly tapered walls, i.e. 88° ("reentrant") or 92° ("retrograde"). With proper modifications to the procedure the cryogenic process can be used.

In implementing the Bosch process, also known as pulsed or time-multiplexed etching), two modes were used in sequence to achieve a substantially vertical wall structure. The alternating applications were:
 i. A standard, nearly isotropic plasma etch. The plasma contains some ions, which attack the wafer from a nearly vertical direction. Sulfur hexafluoride [$SF_6$] was one of the compounds used for the silicon wafer.
 ii. The deposition of a chemically inert passivation layer. (For instance, $C_4F_8$ (octafluorocyclobutane) source gas yields a substance similar to Teflon.)

Each phase lasted for several seconds. The passivation layer protects the entire substrate from further chemical attack and prevents further etching.

However, during the etching phase, the directional ions that bombard the substrate attack the passivation layer at the bottom of the trench (but not along the sides). They collide with it and sputter it off, exposing the substrate to the chemical etchant.

These etch/deposit steps were repeated many times over resulting in a large number of very small isotropic etch steps taking place only at the bottom of the etched pits. To etch through a 0.5 mm silicon wafer, for example, 100-1000 etch/deposit steps are needed. The two-phase process causes the sidewalls to undulate with an amplitude of about 100-500 nm. The cycle time can be adjusted: short cycles yield smoother walls, and long cycles yield a higher etch rate.

The overall cantilever and contact points are defined in an initial DRIE. The DRIE etch/deposit steps result in a cavity opening in the silicon wafer 1, having an upright column 3 positioned just off-center of the width of the opposite sides of the cavity opening. The column, as initially formed, is a beam or cantilever that will, after processing become a deflection electrode in the MEMS switch. Column 3 comprises oxide coating 2 on substrate 5 (not shown, shown in FIG. 3).

The cavity from interior wall to wall laterally (the x axis), measures about 9 µm to about 10 µm, and longitudinally, (the y axis) the cavity wall distance ranges from about 23 µm to about 38 µm. The upright column within the trench (which after processing will form the vertically oriented cantilever) measures laterally between about 1 μm and 4 μm in thickness and ranges from about 15 μm to about 30 μm along its longitudinal direction. The dimensions presented vary and are a function of desired depths resulting from different etch rates for different depths.

As depicted in FIG. 2, the DRIE process etches the cavity to obtain a floor 8 having a descending slope. The depth of a first trench formed between a first wall of the silicon wafer and the opposite facing wall of the column is DRIEd to a first depth and the opposite wall of the column opposite a second wall of the silicon wafer is DRIEd to a second and lower depth. The silicon oxide dielectric layer 2 surrounding column 3 is the base on of the column on which an electrode surface layer is later formed. The oxide layer extends around the periphery of the cavity on the vertical sidewalls of the trenches 100, 101, column 3 and floor 8.

The resulting silicon wafer having the cavity situated therein as depicted in FIGS. 1 and 2 shall be referred to hereinafter for convenience as the "switch."

In addition to forming the cavity as described above and the resulting trenches, the DRIE process was also used to form a recessed boundary around the rectangular upper edge of the cavity opening. A silicon oxide thermal insulation coating 2 (or CVD or LPCVD) having a thickness of between about 0.1 μm and 1.5 μm, depicted in FIG. 1 was applied to fill the recessed boundary around the cavity and to cover the walls comprising the sides of the cavity and also the exposed sides of the column within the cavity. In addition to silicon oxide as used, other dielectric oxides such as borophosphosilicate glass (BPSG), phosphosilicate glass (PSG), silicon nitride ($Si_3N_4$), silicon oxynitride ($SiO_xN_y$), or any other suitable dielectric may be used.

FIG. 2 is a side view of the switch depicted in FIG. 1 showing silicon wafer 1, silicon oxide 2, column 3 and polysilicon 4, as well as other elements discussed hereinafter.

Dielectric layer 2, coated on column 3, is also coated initially on the vertical sidewalls 6 and 7 of the cavity and vertical sidewalls 6' and 7' of column 3. The dielectric layer is an insulative material (i.e., electrical insulator) that may be comprised of a dielectric thermal oxide material such as $SiO_2$, $Si_3N_4$, or $SiO_xN_y$, and may be blanket deposited using a CVD method so that it has a thickness in the range of 50 to 500 μm, or preferably 100 μm. Once applied, the dielectric layer may then be anisotropically etched using RIE to remove the unwanted portions.

In the cavity depicted in FIG. 2 of the instant embodiment, trench 100 is formed between cavity wall 6 and column wall 6' and has a depth less than the trench between wall 7' of the column wall and cavity wall 7. As also depicted in FIG. 2, in trench 101, the width between cavity wall 6 and column wall 6' narrower, i.e., is less than the lateral width between column wall 7' and cavity wall 7.

The cavity, comprising the trenches 100 and 101 depicted in FIG. 2, is then temporarily filled with polysilicon 4. FIG. 2 depicts that the two phases of polysilicon filler 4 taper off in the trench from top to bottom asymptotically. The depth of the two trenches shown is between about 50 μm and 150 μm. The polysilicon fill is silane which is introduced into the cavity using LPCVD at high temperature before all other processing.

After the wafer is smoothed with CMP to expose the silicon surface, the wafer presents a smooth and metal-free surface which allows processing to create silicon devices.

After the cavity is temporarily filled with polysilicon as noted above, the active circuits and BEOL processing are undertaken and other wafer processing is performed, including some back end of line (BEOL) for connections. After these steps are completed, the switch construction can be resumed as depicted in FIG. 3.

Figure 3:
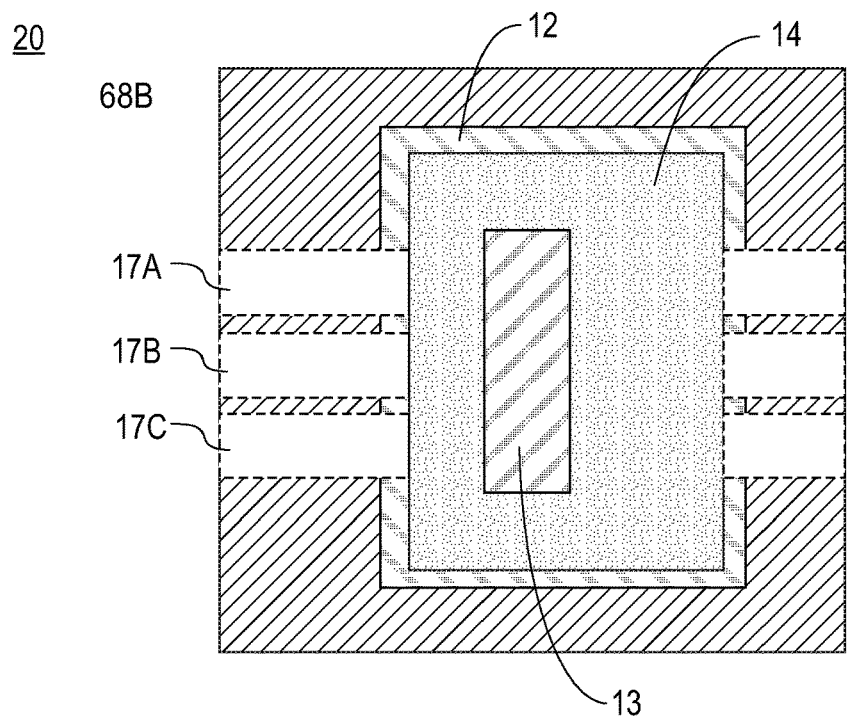
FIG. 3 depicts a top view of the switch showing oxide coating atop a silicon wafer.

FIG. 3 depicts a top view of the switch, showing oxide coating 11 atop the silicon wafer (not shown), silicon oxide 12 filling and/or covering the recessed boundary around the rectangular upper edge of the cavity and the top of column 13 and polysilicon 14 filling the cavity and surrounding the walls of column 13.

On opposite sides of the cavity, using photopatterning and RIE, three parallel trench openings 17A, 17B and 17C are etched into the top oxide coating layer 11 on diametrically opposite sides of the switch. These trenches in the switch will house copper contacts and will serve as drive electrodes in trenches 17A and 17C and a stationary electrode in trench 17B.

Figure 4:
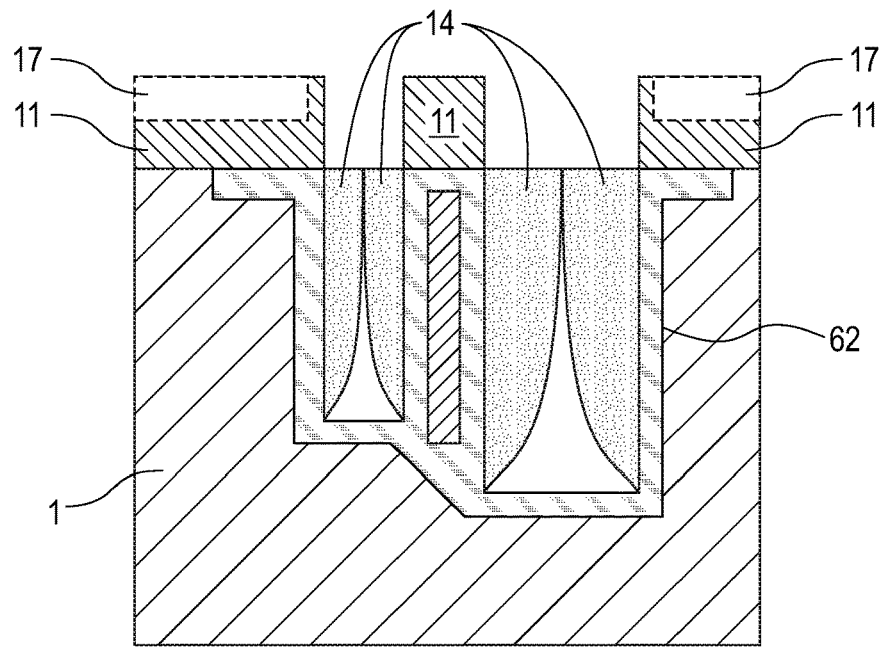
FIG. 4 depicts a side view of the switch depicted in FIG. 3 after processing.

FIG. 4 depicts a side view of the switch depicted in FIG. 3 after processing. FIG. 4 shows silicon wafer 1, an oxide layer 11, dielectric 62 covering the walls of the trenches and column 13, column 13 per se and polysilicon 14. Trenches 17A, 17B and 17C were etched to be used to house the copper contacts wiring connections to the MEMS switch.

Contacts are formed by depositing a blanket layer of preferably copper (Cu), alloys (e.g., $Al_xCu_y$) of primary metals, or other similar metals such as aluminum (Al), using a conventional method of metal deposition, such as electroplating, evaporation, or sputtering, followed by a resist layer applied and photolithographically patterned in a conventional manner to mask the deposited metal where surface contacts are to be formed. With the patterned resist layer operating as an etch mask that serves to protect underlying metal layer at the prospective locations of surface contacts, the metal blanket layer may be etched using Reactive Ion Etching (RIE), or any other suitable dry or wet etching process known to persons with ordinary skill in the art to form surface contacts. Surface contacts may be positioned over via structures formed as part of a BEOL process so that the surface contacts may be electrically coupled with the metallization.

Signals and bias voltages may thereby be provided by the surface contacts to the MEMS switch from devices formed in the underlying integrated circuit (not shown), or from surface contact pads coupled to input/output (I/O) pins.

Alternatively, surface contacts may be electrically coupled to other devices and interconnect structures using surface interconnections, which may be formed as part of the surface contact fabrication process. The switched signals may be, for example, in accordance with the present invention, radio frequency (RF) signals.

Figure 5:
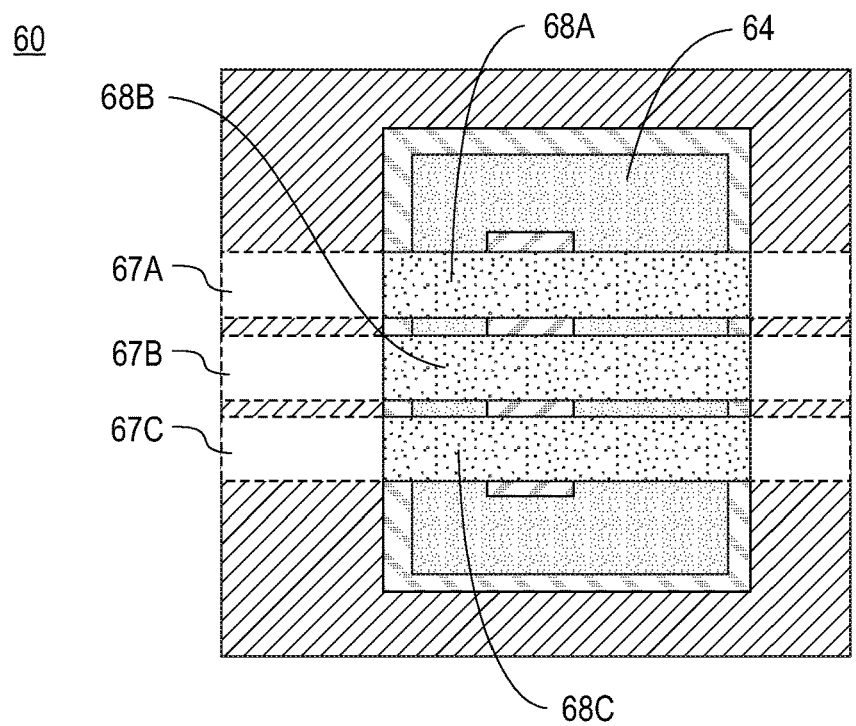
FIG. 5 is a top view showing and incorporating elements of the switch depicted in FIGS. 1-4 after processing.

FIG. 5 shows and incorporates therein the silicon wafer, silicon oxide, column and polysilicon elements of the switch depicted in FIGS. 1-4 after processing. Using photo-patterning and RIE the oxide layer over the cavity is opened. The photopattern is applied to expose slots over the future cavity for the contacts.

Using the DRIE process, openings 68A, 68B and 68C are created adjacent to one another in alignment with trenches 67A, 67B and 67C respectively at each end thereof. The openings extend across the width of the cavity as shown and cover polysilicon filler 64 in the cavity. Trenches 67A, 67B and 67C are essentially "slots" as when they are etched into the wafer, i.e., they form an aperture or slit in the surface thereof for something (i.e. a conductive metal) to be inserted.

Figure 6:
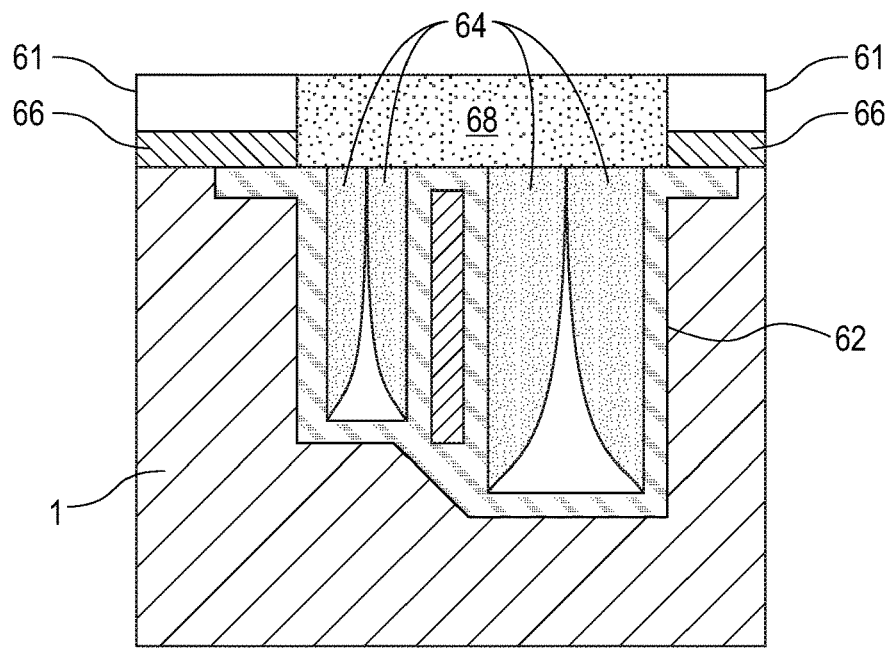
FIG. 6 is a side view of the elements depicted in FIG. 5.

FIG. 6 is a side view of the switch depicted in FIG. 5. Silicon wafer 1, photoresist layer 61, silicon oxide coating 62 covering the walls of the trenches, oxide coating 63, polysilicon 64 oxide layer 66 are depicted along with DRIE opening 68.

The switch shown in FIGS. 5-6 is subjected to a further process in which a thin blanket of seed layer comprising Ta/TaN+500 Å-1000 Å sputtered copper is deposited everywhere on the top surface but only in the electrode locations in the cavity using a CVD or LPVCD process.

After the Ta/TaN and copper seed layer has been deposited over the cavity (with RIE), the polysilicon in the cavity is removed using a hydrofluoric acid (HF) wet etch, RIE, or any other suitable dry or wet silicon etching process known to persons skilled in the art. The etching process is used to etch any free standing seed layer. The polysilicon removal step leaves the Ta/TaN Cu seed layer free-standing where it contacts the oxide layer.

The free-standing Ta/Ta/Cu was deposited on the silicon wall and was removed with a short RIE step. The polysilicon is removed to eliminate seed bridging the switch gap. The Ta/TaN and copper seed is deposited. The photoresist is removed and the polysilicon is removed from the trenches.

For the purposes of either embodiment of the present invention, Ta/TaN under copper and Ti/TiN under W is preferred but both can be used interchangeably.

Figure 7:
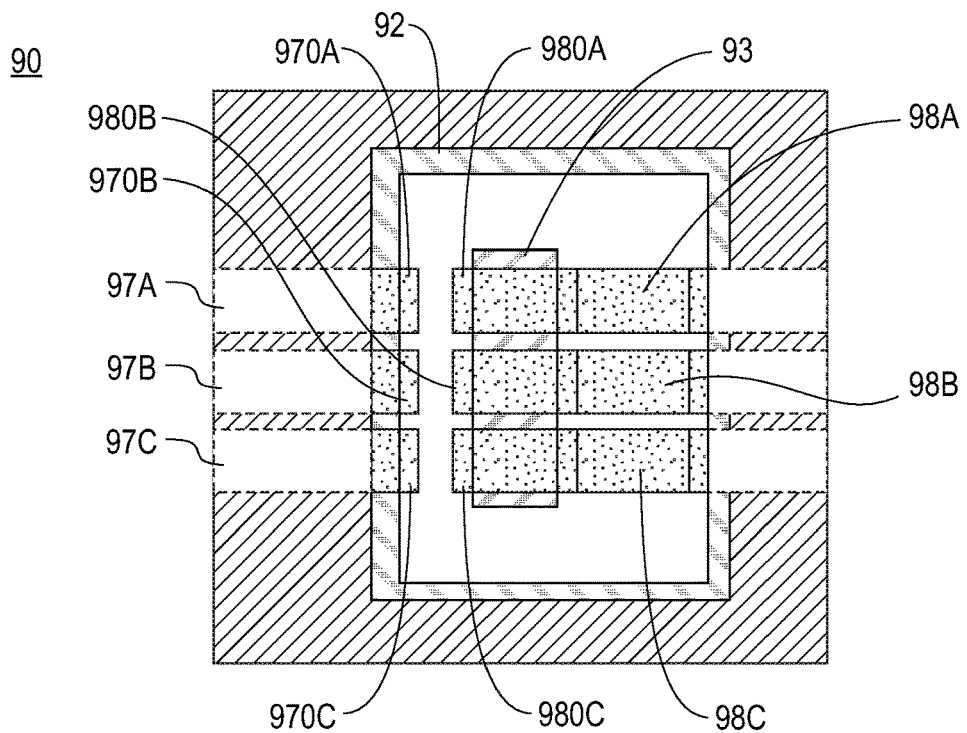
FIG. 7 depicts the switch resulting from after a seeding process.

FIG. 7 depicts the switch resulting from the processing as described above. The switch 90 consists of oxide layer 91, $SiO_2$ layer 92 covering the walls and the beam (column) 93 of the switch, seeded lines 98A, 98B and 98C and unfilled trenches 97A, 97B and 97C on both sides of the cavity to be used for copper wiring connections to the switch.

The seed layer is comprised of Ta/TaN Cu as stated, or another suitable conductor with material properties appropriate to operate as a diffusion barrier and an adhesion promoter.

The seeded lines 98A, 98B and 98C extend from a circuit contact point at one side of the switch through the cavity with said lines enveloping a front side and a back side of column 93. The line 98B at 980B on column 93 will be the contact point for the deflection electrode in the switch. Lines 98A and 98C and respectively 980A and 980C will serve as drive electrodes. Contact 980B which will connect with line 978 when electroplated will serve as the stationary electrode when the switch is completed. There is a break in the seeded lines at the bottom of the back side of column 93. The gap between the stationary electrode and the deflection electrode when the switch is complete is narrow. It is therefore difficult to apply the Ta/TaN Cu seed across the bottom of the trench so as a result, the seed and later the copper plate will not reach the bottom of the trench using the processes for depositing same.

Figure 8:
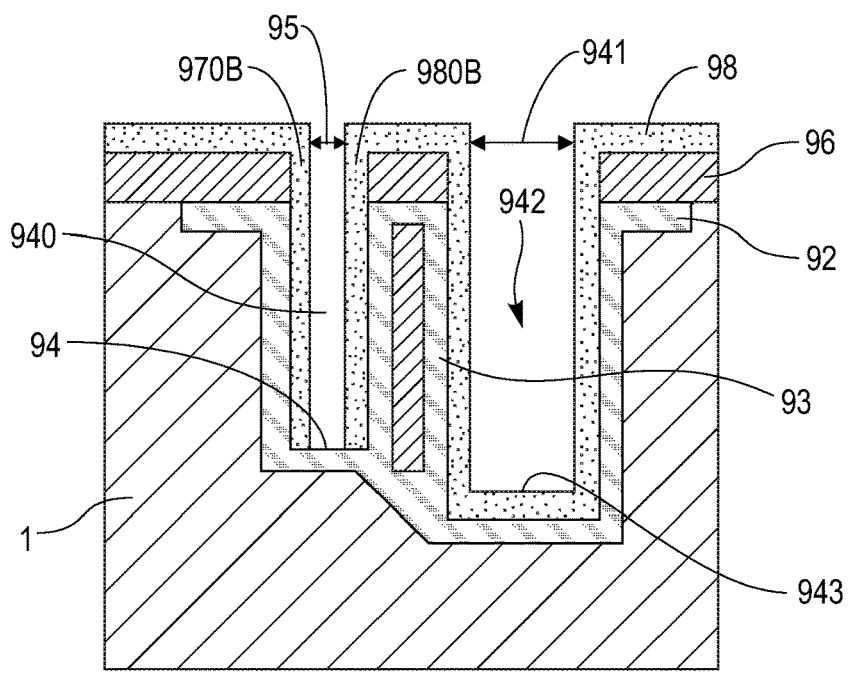
FIG. 8 is a side view of the switch illustrated in FIG. 7 and showing the silicon wafer 1, $SiO_2$ coating, contacts and photoresist seed material.

FIG. 8 is a side view of the switch illustrated in FIG. 7 and shows the silicon wafer 1, $SiO_2$ coating 96, contacts 970B and 980B, photoresist and Ta/TaN Cu seed material 98 covering column 93 down the sides of trench 942 and the bottom thereof. Since gap 95 at the top of trench 940 depicted is narrow, the seed and later plate till will not reach bottom 94 of trench 940 and thus will not make continuous contact at that location. A resist mask may be necessary to protect the beam (column) in the wide gap 941.

Once the Ta/TaN Cu seed layer has been deposited, the electrodes are copper electroplated. The copper is plated uniformly to provide a path when the circuit is closed from an external RF signal contact input to the switch to an external RF signal output contact at a different side of the switch.

The current in the conductive path moves horizontally, and then vertically to reach the narrow gap. The copper plated electrode(s) on layered column 93, which serves as the vertical cantilever, anchored at the base of the cavity are configured to run down to the bottom 943 of etched trench 942 up a side wall of the column 93 to the top thereof and down the other side wall of column 93 in trench 940 terminating at the bottom 94 of trench 940.

The width of the gap 95 between cantilever contact 980B and the contact 970B determines whether the copper plating extends all the way to the bottom of the cavity or stops somewhere short of that on wall extending into trench 940 beneath contact 980B. Following electroplating the copper, a CMP process removes the excess copper on the wafer surface that protrudes above the wafer plane (damascene process.) If necessary, the CMP is removed from out of the cavity (wash step.) The electrodes will then need a corrosion resistant coating.

Figure 9:
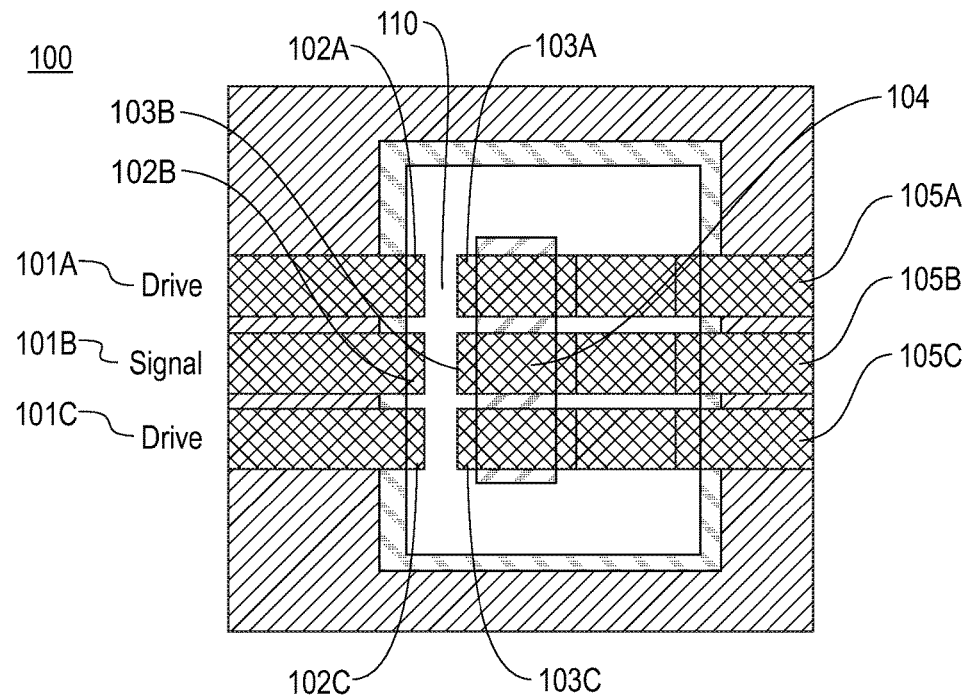
FIG. 9 is a top view of the switch after electroplating step has been applied to the seeded.

FIG. 9 is a top view of the switch 100 after an electroplating step has been applied to the seeded substrates. The elements of the switch described in FIGS. 7 and 8 are identical to those depicted in FIGS. 9 and 10 with the exception that electroplated copper replaces the element described as "seed." The copper has been plated uniformly to reach a narrow gap 110.

In FIG. 9 electroplated copper lines 101A, 101B and 101C contact copper contacts 102A, 102B and 102C. Of these copper contacts, contacts 102A and 102C serve as drive electrode contacts. Contact 102B serves as the stationary, or signal electrode. Alternatively, drive electrodes 102A and 102C, which are charged to close the switch and the signal electrode 102B, can be electrically isolated after an initial thin plating of copper with the relative thicknesses of the electrodes adjusted accordingly.

Figure 10:
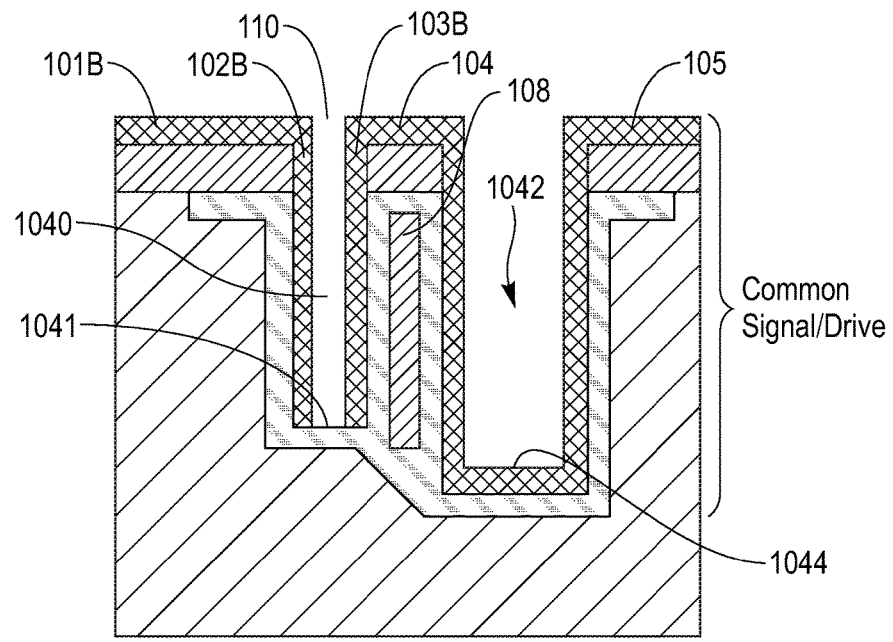
FIG. 10 is a side view of the switch depicted in FIG. 9.

With respect to the switch depicted in FIG. 9, contacts 103A, 103B and 103C are positioned at the upper edge of the beam cantilever 110 (as is shown in FIG. 10) diametrically opposite copper contacts 102A, 102B and 102C respectively, with gap 110 separating the two contacts. Contacts 103A and 103C serve as drive electrodes and contact 103B is the contact point for completing a circuit connection with signal electrode 102B. Contact 103B is the end terminal of deflection electrode 104.

FIG. 10 is a side view of the switch depicted in FIG. 9. FIG. 10 depicts inlet/outlet line copper lines 105 extending continuously through trench 1042 to the top surface 104 of cantilever 108, and down the side of cantilever 108 terminating at the bottom 1041 of trench 1040. Cantilever 108 forms the deflection electrode. Inlet/outlet line 101B terminates at contact 102B and extends downwardly along the wall in trench 1040 terminating substantially at the bottom 1041 thereof. The latter copper line serves as the stationary electrode whereas, as mentioned, the former serves as the deflection electrode.

Figure 11:
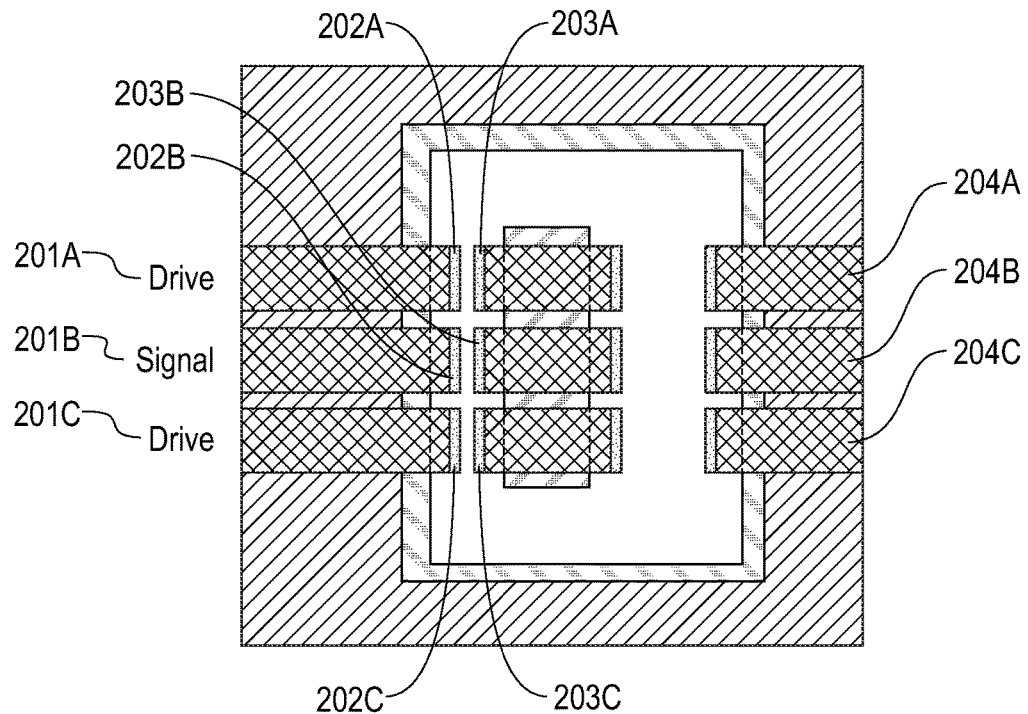
FIG. 11 is a top view of the switch showing electroplated copper lines.

FIG. 11 is a top view of the switch with its electroplated copper lines. The elements, numbered and otherwise, of the switch described in FIGS. 9 and 10 are identical to those depicted in FIGS. 11 and 12 with the exception that a passivation layer, i.e., a blanket deposit of a dielectric oxide or nitride insulator composition such as $SiO_2$, $Si_3N_4$, or $SiO_xN$ has been patterned onto the upper edges of the drive electrodes, the stationary electrode and the deflection electrode at the top of the switch. As a result of the hard dielectric film blanket thereon, electrodes 202A, 202B, 202C and 203A, 203B and 203C are insulated to form a capacitive switch. The stationary electrode 202B serves as a metallic coplanar waveguide (CPW) that is passivated with the dielectric (oxide).

When a voltage is applied between the deflection electrode 203B and the signal lines 202A and 202C from stationary electrode 202B, the deflection electrode 203B is moved to contact stationary electrode 202B due to electrostatic attraction.

When the voltage is removed, the mechanical restoring force causes it to return to the up position. In the up-position the capacitance between the electrode and the signal line is low (1-100 fF), allowing the R.F. signal to pass to the output port unimpeded. In the down-position the capacitance is high (1-10 pF) and the R.F. signal is coupled to the ground.

Figure 12:
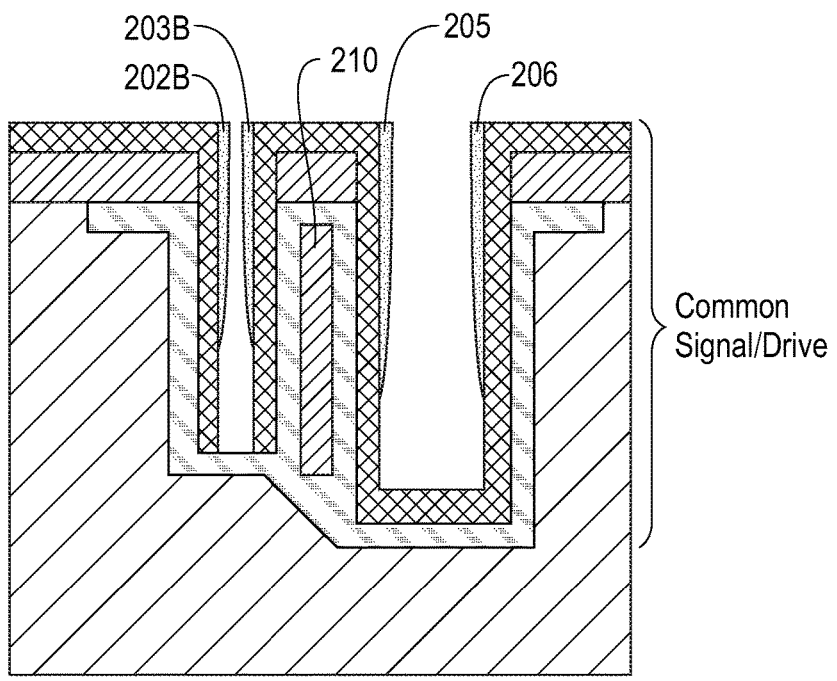
FIG. 12 is a side view of the switch depicted in FIG. 11 showing the areas seeded with the oxide or nitride compositions.

FIG. 12 is a side view of the switch depicted in FIG. 11 showing the areas seeded with the oxide or nitride compositions such as mentioned above have been deposited at 202B, 203B, the top surface of beam cantilever 210, and at 205 and 206. The hard electrode surface can either be tuned to almost close the gaps, with a narrower gap for the signal electrode pair, or the gap can be closed all the way and electro-etched to reopen a small gap of desired width. Some known patterning steps may be necessary to control the relative thicknesses. The drive gaps need to be big enough so that no shorting can occur, while the signal gap closes as the cantilever bends when the drive electrodes are charged. The common electrode can be split into separate drive and signal electrodes.

Because MEMS switches have sensitive moving pans, in most instances, when used in conjunction with integrated circuit chips, they require protection from external elements to ensure continued proper function.

To provide protection, the MEMS switch is sealed in a protective cavity lid to keep out foreign matter, and to prevent corrosion or infiltration of moisture into the MEMS switch.

Figure 13:
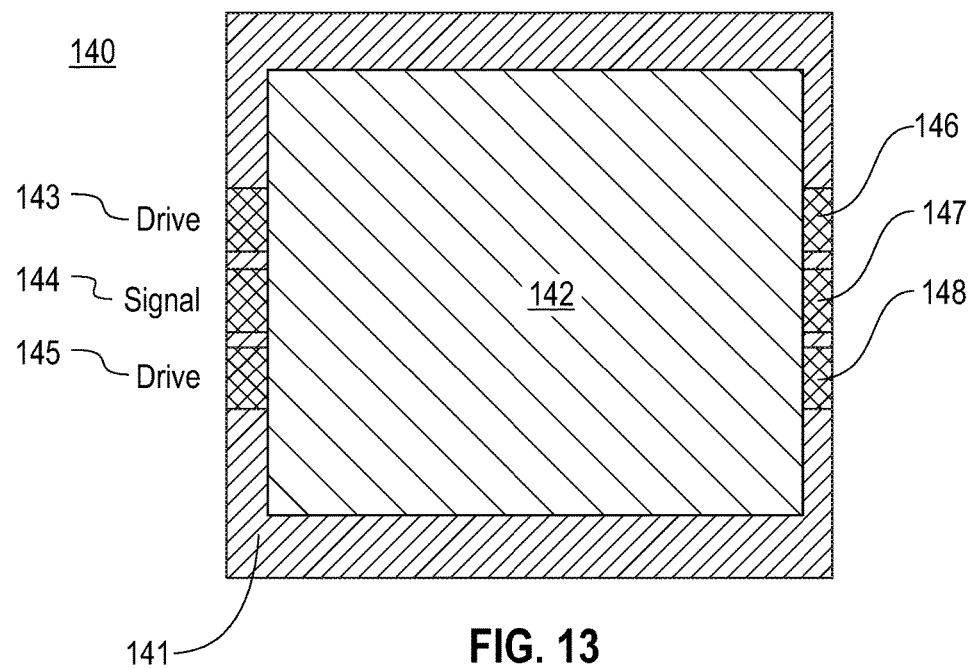
FIG. 13 depicts the MEMS protective cavity lid on the silicon wafer.

FIG. 13 depicts such a lid 142 which can be assembled and switch silicon wafer 141 using any embodiment and method known in the prior art. Inlet and outlet lines 143, 144, 145, 146, 147 and 148 are depicted.

Figure 14:
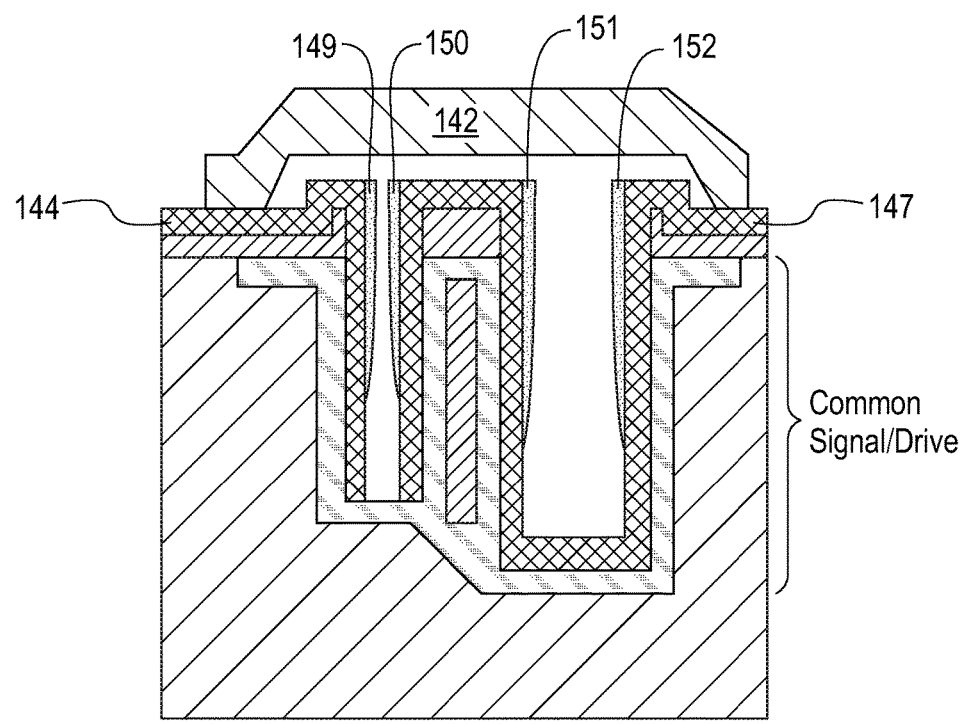
FIG. 14 is a side view of the finished MEMS switch showing lid and a gap located between insulation elements contact points on the stationary electrode and the deflection electrode.

FIG. 14 is a side view of switch 140 showing lid 142, inlet and outlet lines 147 and 144. A gap 151 is depicted between an insulation element 149 covering a contact point on stationary electrode 151 and covering a contact point on deflection electrode 152.

When the MEMS switch of the embodiment of the present invention disclosed above is fully assembled, such switch includes a stationary signal electrode and a deflection electrode flanked by drive electrodes. The stationary electrode and the deflection electrode have a confronting spatial relationship with a gap therebetween.

The stationary electrode and the deflection electrode are positioned laterally relative to each other so that a contact gap is formed between the stationary electrode and the deflection electrode; likewise, an actuation gap is formed between the deflection electrode and the drive electrodes. The contact gap may be range from 0.5 nm to 500 nm in width, preferably about 200 nm.

The actuation gap may be slightly larger than the contact gap, so that the stationary electrode is positioned to stop the lateral displacement of the deflection electrode before the deflection electrode contacts the drive electrodes. This impediment to the displacement posed by the stationary electrode blocks the deflection electrode from contacting and shorting to the drive electrodes.

The conductive cantilevered arm defined by the electrode conductive layer of deflection electrode is an integral part the bottom of the cavity. The conductive cantilever comprising the deflection electrode has an upper portion that is free to move toward the stationary electrode under the externally applied electrostatic force. The cantilever has a flexibility that permits the deflection to close the switch under the externally applied electrostatic force and to open the switch when the externally applied electrostatic force is removed.

In operation, a bias voltage is applied to the drive electrodes which develops a potential difference between the drive electrodes and the deflection electrode. The potential difference causes an attractive electrostatic force to develop between the drive electrodes and the deflection electrodes which in turn causes the deflection electrode to bend with a cantilevered motion towards the stationary electrode. The positioning of the drive electrodes relative to the deflection electrode promotes the existence of a symmetrical attractive electrostatic force.

To insure reliable closure of MEMS switch during actuation, the bias voltage applied to the drive electrodes will typically exceed the pull-in voltage, and is commonly referred to as the actuation voltage for the MEMS switch. If a bias voltage exceeding a pull-in voltage for the MEMS switch is applied to the drive electrodes, the deflection electrode may deflect by a distance sufficient to physically contact the stationary electrode, forming an electrical contact between the two electrodes and thereby causing the MEMS switch to enter into a closed state.

When the bias voltage is removed from the drive electrodes the elastic properties of the deflection electrode cause it to revert or return to an equilibrium position, opening up the contact gap and causing the MEMS switch to enter an open state. The MEMS switch may be employed to provide mechanical switchable contact between the deflection electrode and the stationary electrode through an electrical signal on the drive electrodes.

The pull-in voltage necessary as a bias potential to cause MEMS switch to enter a closed state may be in the range of 1 volt to 50 volts, or possibly 3 volts to 5 volts.

An Alternate Embodiment

The other embodiment of the present invention comprises a MEMS switch as described hereinafter integrally coupled with a single or dual damascene structure thus forming a single unit.

In this embodiment, tungsten fill in each of the several trenches etched out of the silicon component serves as deflection, stationary and drive electrodes.

The advantage of the tungsten process is that the tungsten makes the electrodes from the start and there is no need to add any additional materials in the trenches later. One only needs to create contacts at the wafer surface to the tungsten to obtain a finished MEMS switch.

A dual damascene structure comprises a first etch-stop layer, a first dielectric layer, a second etch-stop layer, and a second dielectric layer. Before copper processes inside the dual damascene structure above the copper metal layer are performed, a barrier layer has to be formed to prevent copper atoms from diffusing into surrounding dielectric layers.

As was the situation with respect to the MEMS switch described above, in order to prevent copper atoms from diffusing into dielectric layers, titanium nitride (TiN) or tantalum nitride (TaN) is usually used to form a barrier layer. The need for thoroughly depositing a barrier layer of the sidewall of a dual damascene structure is to prevent copper atoms from diffusing into surrounding dielectric layers.

More specifically, the copper metal layers of the dual damascene structure are separated by thick, silicon dioxide insulating layers. Vias are made through the insulating layers to make connections between the metal lines. It is often desirable that the metal conducting lines be maintained in as much of a plane as possible to avoid undue stresses on the metal lines. A tungsten metal plug is often used to fill the via, or contact hole, in the insulating layer covering a first metal line so that the overlying metal layer from which a overlying second metal line is formed remains on the planar surface of the insulating layer. Without the plug, the overlying metal layer must dip into the via to make contact with the underlying first metal line.

A layer of titanium (Ti) is typically placed in contact with the underlying first metal line to facilitate the formation of controllable low ohmic contacts. As the Ti layer is very reactive, a layer of titanium nitride (TiN) is placed in contact with the plug as a reactive barrier layer between the tungsten and the Ti layer. For example, if the underlying first metal is aluminum, a Ti layer is conventionally placed TiN on the aluminum layer, followed by a TiN layer, and then the tungsten layer. The Ti layer also acts as a "glue" between the insulating layer and the TiN layer.

Figure 15:
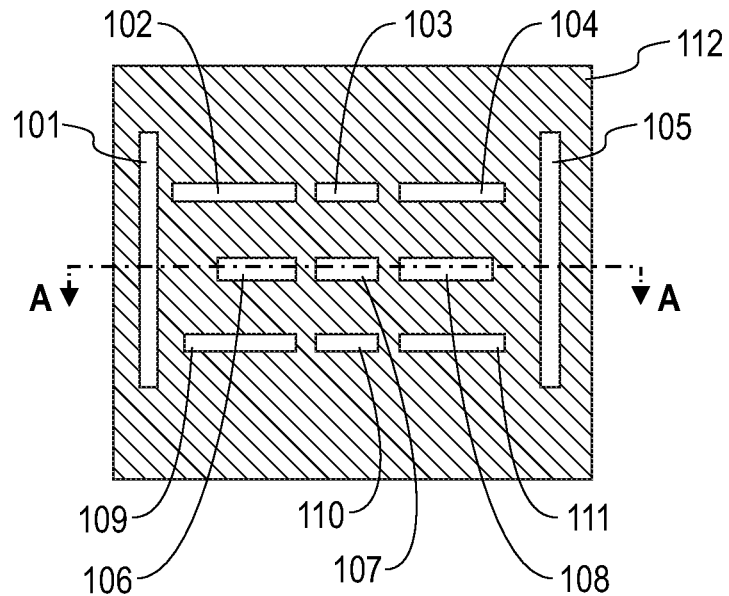
FIG. 15 is a top view of a silicon wafer comprised of a dielectric material showing trenches that have been etched using a photoresist pattern and the DRIE process.

FIG. 15 is a top view of a silicon wafer comprised of a dielectric material showing trenches 101 to 111 that have been etched using a photoresist pattern and the DRIE process. The trenches formed in the silicon wafer body measure about 3 µm wide and 150 µm deep.

Figure 16:
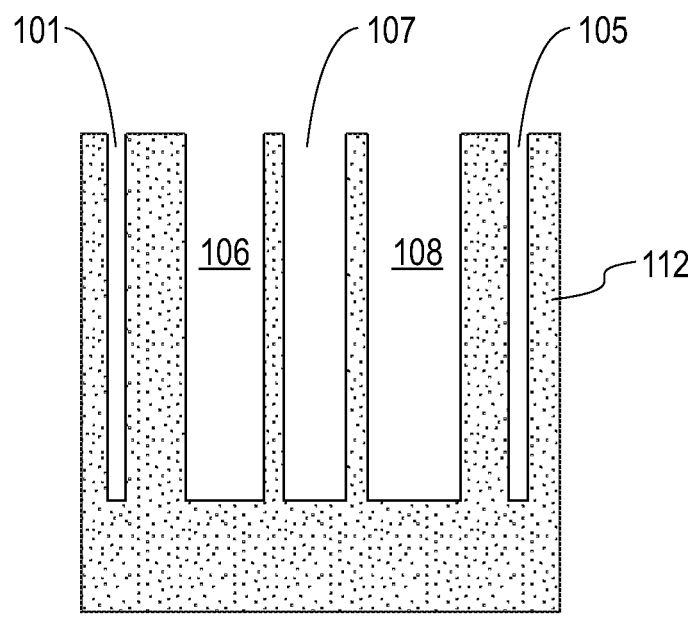
FIG. 16 is a side view of the silicon wafer body along the line A-A showing trenches.

FIG. 16 is a side view of the silicon wafer body along the line A-A showing trenches 106, 107, 108.

FIG. 17 is a top view of the exposed upper surface of the silicon wafer and the trenches having been subjected to a thermal oxide or CVD oxide coating 113. As a result of the deposition of 1 µm of the thermal oxide coating, the trenches are subsequently narrowed to a width of 2 µm.

The narrow gaps between trenches are chosen so that the thermal oxide grows between shapes to form a continuous structure. This may be accomplished with a small spacing between DRIE opening as shown, or by tapering a continuous DRIE trench to a width less than the oxide thickness such that it completely fills with oxide. This latter approach is compatible with CVD oxide depositions since it does not require growth of the oxide into the silicon.

The oxide deposited surrounds each cavity and the oxides blend together where the cavities are closely spaced. The dotted rectangular line indicated in FIG. 17 is the inner extent of the oxide, and there is another outline showing the outer extent of the oxide. The thermal oxide as deposited grows out into the silicon wafer thereby connecting the oxide of adjoining cavities.

There is an alternative version for other oxides (CVD, LPCVD). In that case, the regions where oxide is intended to join electrodes together are defined by narrow trenches such that the oxide fills the trenches so that the CVD W cannot be deposited. This approach would be advantageous because the oxide process temperature is lower and there is less risk to devices made before the switch process steps start.

FIG. 18 is a side view of the silicon wafer along the view B-B showing trenches 106, 107 and 108 and the layer of oxide coating 113 covering the side walls forming the trenches.

FIG. 19 is a side view of the silicon wafer along the view B'-B' showing trenches 109, 110 and 111 and the layer of oxide coating 113 covering the side walls forming the trenches.

The next step, not shown is to apply a blanket Ti/TiN or Ta/TaN liner to the walls of the trenches using a CVD method and applying the liner at a thickness of about 500 Å to 1000 Å. The lined trenches are then filled with W creating an oxide beam cantilever that is 150 µm long by 4 µm thick with 2 µm thick W electrodes embedded. There is a range of up to twice the suitable trench dimensions with finer features possible for shallower trenches/shorter beams.

The travel distance, when the final electrodes are ultimately formed to make contact has a minimum of about 2 µm. The beam width is determined by available actuation voltage such that the area of the capacitor plates defined by the drive electrodes is sufficient.

If a more flexible structure is needed, some of the oxide in the first layer deposited over the W can be removed and replaced with LPCVD Si which will be removed at later step. This creates a more flexible hinge point at the top of the cantilever beam.

FIG. 20 is a top view of the wafer with etched and lined openings 501 to 512 filled with W plugs and CMP performed to remove the non-selective layer, stopping when the oxide layer is reached. RIE is applied to remove the excess Ti/N. The W plugs inserted in the trenches will form the various electrodes needed to function in this MEMS switch embodiment.

For the purpose of identifying the functions of the various electrodes in the instant MEMS switch embodiment, and their arrangement, the "A" drives are identified as elements 502 and 504, and the "B" drives are identified as elements 509 and 511.

The common signal drive are elements 506 and 507. The actual "A" signal is depicted at 503, and the actual "B" signal is depicted at 510. The input signal is emanates from 507. Elements 501 and 505 in FIG. 20 have no substantive function. The benefit they provide is that the oxide surrounding them completes the wall of the cavity 512.

In this embodiment, when a voltage is applied between the A and the common drive lines, the bottom of the central beam will be pulled toward the A side and the input line will become capacitively coupled to the A signal line. When a voltage is applied between the B and common drive lines, the input line will approach and couple to the B signal line.

FIG. 21 is a side view of the silicon wafer along the view C-C showing trenches 506, 507 and 508 filled with W plugs and the layer of oxide coating 113 covering the side walls forming the trenches.

FIG. 22 is a side view of the silicon wafer along the view C'-C' showing trenches 509, 510 and 511 with W plugs and the layer of oxide coating 113 covering the side walls forming the trenches.

In this embodiment as depicted in the FIGS. 20-23 of the drawings, three separate aligned DRIE high aspect ratio closely spaced trenches are etched, as noted hereinafter, in a first row 502, 503, 504, in a second row 506, 507, 508 and in a third row 509, 510, 511. Each trench, i.e., 502-511 is lined with a thermal oxide and is ultimately filled with a tungsten plug, there being an area on said upper wafer surface that is not layered with thermal oxide, but is covered with a dielectric layer.

Each of the trenches in said first row, said second row and said third row is connected by a continuous lining of thermal oxide wherein the thermal oxide that surrounds each trench blends together in the space between adjacent trenches, as depicted in FIG. 20 in the dotted rectangular lines encompassing the non-oxide areas.

The first row of trenches with the thermal oxide connecting same together and the third row of trenches with the thermal oxide connecting same together form an "outer" group.

The second row of trenches with thermal oxide, which group is located between the first row of trenches and the third row of trenches forms an "inner group." The areas in line and bordering the first, second and third groups which are covered with thermal oxide are designated in FIG. 20 as being within the dotted lines shown.

FIG. 20 shows the trenches in the first, second and third rows, filled with tungsten plugs.

A dielectric layer is applied on the upper silicon wafer surface covering an area between said inner group and said outer group that is not covered with said thermal oxide.

An area up from the bottom of the silicon wafer, i.e., the lower surface of and within the silicon wafer in vertical alignment with the inner group on the upper surface of the silicon wafer is etched, to result in the inner group serving as a free-standing beam cantilevered having a base extending to the dielectric layer on the upper surface of the silicon wafer.

The deflection electrode is configured to be electrostatically attracted toward the drive electrode with a cantilevered motion when the drive electrode is electrically biased, with the result that said insulated contact point on said conductive layer of said deflection electrode contacts said insulated contact point on said conductive layer of said stationary electrode.

After the upper portion of the silicon wafer body has been processed as described above, the lower portion of the silicon wafer body is subjected to a standard double damascene process, although single damascene and BEOL processes can also be used.

A suitable method of creating an interconnect wiring network preferably used in accordance with the present invention is the dual damascene (DD) process. In the standard DD process, an inter metal dielectric (IMD), consisting of two layers is coated onto a substrate.

In general, these two layers can be made of the same or different insulating films and in the former case can be applied as a single monolithic layer. A hard mask layer or a layered stack is optionally employed to facilitate reactive ion etch selectivity and to serve as a polish stop. The wiring interconnect network consists of two types of features: line or trench features that traverse a distance across the chip, and via features that connect lines in different levels of interconnects in a multilevel stack together. Historically, both layers are made from an inorganic glass like silicon dioxide ($SiO_2$) or a fluorinated silica glass (FSG) film deposited by plasma enhanced chemical vapor deposition (PECVD).

In the dual damascene process, the position of the lines and the vias are defined lithographically in photoresist layers, and transferred into the hard mask and IMD layers using reactive ion-etching processes. The process sequence is called a "line-first" approach.

After the trench formation, lithography is used to define a via pattern in the photoresist layer and the pattern is transferred into the dielectric material to generate a via opening.

The dual damascene trench and via recessed structure s then coated with a conducting liner material or material stack that serves to protect the conductor metal lines and vias and serves as an adhesion layer between the conductor and the IMD. This recess is then filled with a conducting fill material over the surface of the patterned substrate. The fill material is most commonly obtained by electroplating of copper, although other methods such as chemical vapor deposition (CVD) and other materials such as Al or Au can also be used. The fill and liner materials are then chemical-mechanical polished (CMP) to be coplanar with the surface of the hard mask and the structure.

Figure 25:
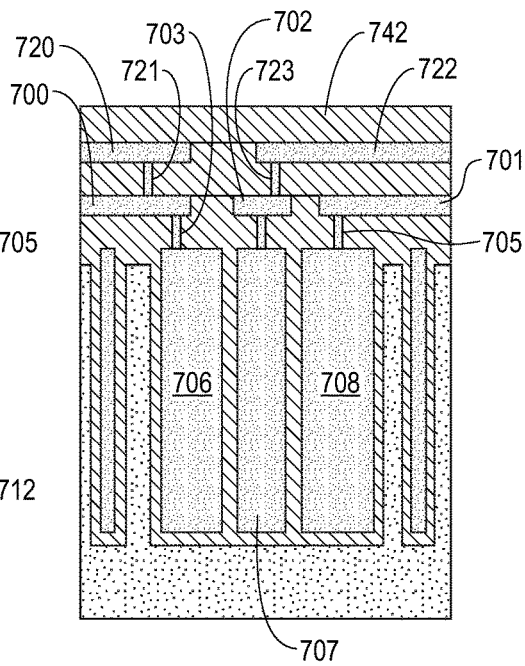
FIG. 25 show a cross section of FIG. 24 along the view D-D with lines connected to vias forming a dual damascene structure.

A capping material 742 is deposited as a blanket film, as is depicted in FIG. 25 to passivate the exposed metal surface and to serve as a diffusion barrier between the metal and any additional IMD layers to be deposited over them. Silicon nitride, silicon carbide, and silicon carbonitride films deposited by PECVD are typically used as the capping material. This process sequence is repeated for each level of the interconnects on the device. Since two interconnect features are simultaneously defined to form a conductor in-laid within an insulator by a single polish step, this process is designated a dual damascene process.

In the single damascene process a dielectric layer is etched and a barrier layer of, e.g., Ta/TaN is deposited on the etched trenches. A copper seed layer is then deposited on the Ta/TaN liner. Copper fill is finally electroplated on the copper seed layer and the excess metal is removed using the CMP polishing/planarization process.

The specific dual damascene sequence of steps used in accordance with the present invention consists of the following steps:

Silane oxide is deposited using CVD or TEOS to thickness of 0.1 μm to 3 μm. The silane oxide is the dielectric used to surrounding the wires to be incorporated in the switch. Apply a photoresist, then photopattern for forming line trenches that will be used to contain wires. Trenches are etched using RIE, and after completion of same, the resist is cleared. With the line trenches in place, another photoresist, then photopattern is performed for forming vias to connect lines for wiring to line layer below. Vias are etched using the RIE process. The order of steps photoresist, photopattern and RIE forming, lines and visa can be reversed.

Once the lines and vias are etched, between about 100 Å-1000 Å Ta/TaN blanket film (seed) plus between about 500 Å and 1000 Å sputtered Cu seed is coated on the lines and vias. The next step is to electroplate a blanket of copper to overfill the trenches, then CMP copper to remove all copper not in etched regions. The Ta/TaN seed (where not covered by Cu) is removed using RIE. Finally a SiN or SiCOH blanket cap having a thickness of between about 50 Å-500 Å is coated to cover the interior of the processed wafer.

Figure 23:
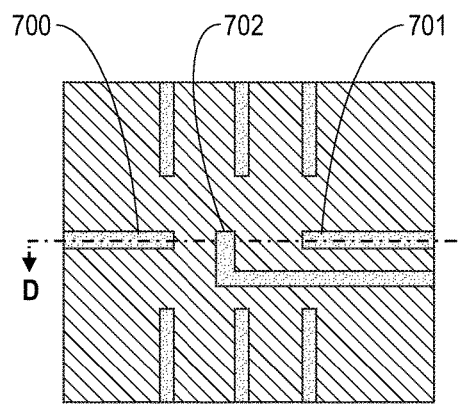
FIG. 23 is a view of the underside of the silicon wafer body which was processed using a standard double damascene method

FIG. 23 is a view of the underside of the silicon wafer body which was predominately processed using the standard double damascene method described above. Using a DRIE, trenches were etched into the silicon wafer body to be used for wiring to interconnect the vias to the W plugs.

Ta/TaN liner was deposited and copper fill plated and the CMP removed, excess metal. A cap layer of SiN or SiCOH, or any suitable cap layer, is coated thereon in a thickness noted above. FIG. 23 view shows lines 700, 701 and 702 and other lines not numbered.

Figure 24:
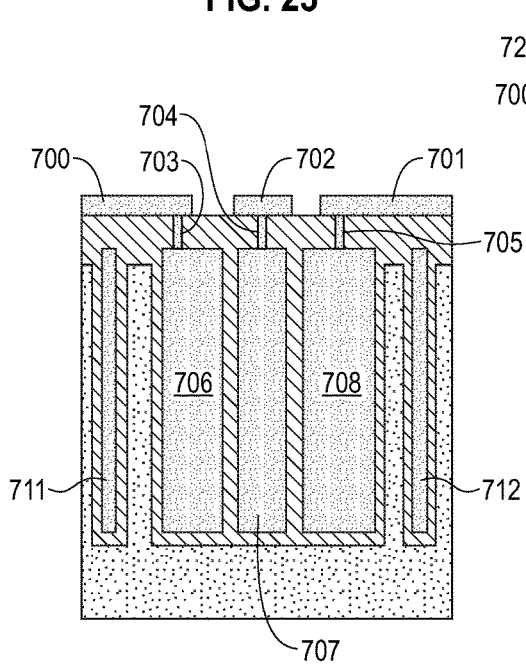
FIG. 24 shows a cross section of the switch depicted in FIG. 23

FIG. 24 shows a cross section of the switch depicted in FIG. 23 along the line D-D shown in FIG. 23. Lines 700, 701 and 702 are shown along with vias 703, 704, and 705. Plugs 706, 707 and 708 are connected to lines 703, 704, 705 through vias 703, 704, 705 respectively. Tungsten plug 706 will be processed to be a stationary electrode and 707 will be the deflection electrode and 708 will be a drive electrode.

FIG. 25 show a cross section of FIG. 24 with lines 720 and 722 connected to vias 721 and 723 respectively connected to lines 703 and 704 forming a dual damascene structure.

Figure 26:
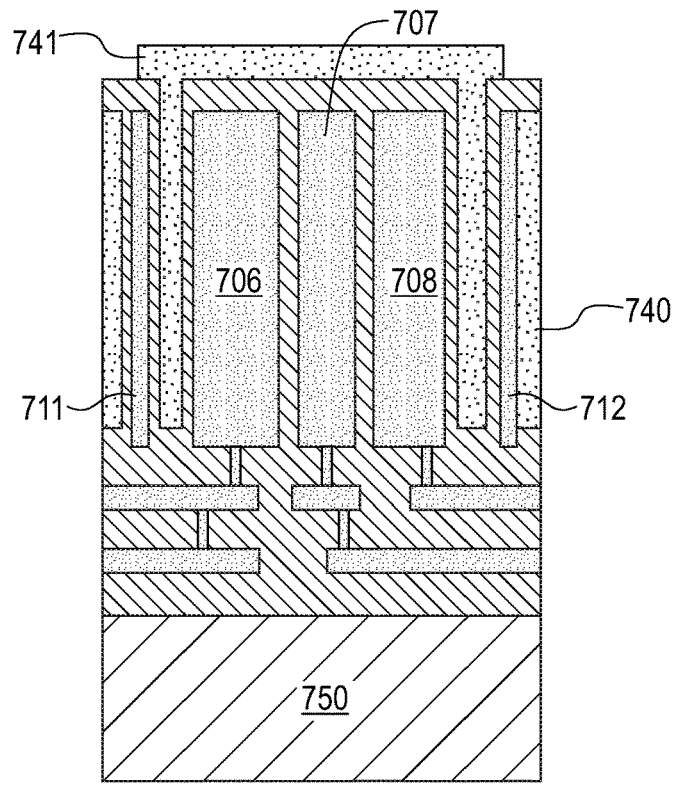
FIG. 26 is a cross sectional view depicting a MEMS switch with all elements shown in FIG. 25 attached to a temporary handler wafer.

Once the damascene process has been completed, the structure 740 including all elements described above and depicted in FIG. 25 is attached to a temporary glass handler wafer 750 as shown in cross sectional view FIG. 26. The glass handler wafer is a disc of borosilicate glass, having a thermal expansion matched to silicon and is bonded to the silicon wafer top surface. The temporary handler wafer is typically about 700 μm thick.

After finishing the wiring of electrical pads on the wafer surface, the wafer is coated with a thermal adhesive.

Handler 750 supports the silicon wafer being thinned. A grinding tool grips the glass side, and the silicon backside is ground off to the W slugs, or near the W slugs located with the wafer. If the oxide coating is not exposed, the bottom of the wafer is further etched with RIE or wet etch. After thinning, backside steps are performed.

The insulation material 741 is the original silicon deposited early in the process, and remains surrounding the oxide/W pillar and bounded by the oxide walls that include the stationary electrodes.

When this silicon forming the wafer is etched out below, the pillar is left standing in a cavity. Prior to this etch step there are no empty volumes. Following the etch step as noted, 1 μm-2 μm silicon is deposited using an LPCVD process. Applying a photopattern resist, an RIE process is implemented to define a lid spacer which is a small bump of Si on the pillar end, so that the oxide in next step to follow in the overall process does not bind to the top of the pillar.

In the case where the grind stops short of the pillar, with the result that the pillar (beam) is still surrounded by Si, the aforementioned steps are not needed. Then, 1 μm-2 μm CVD oxide is deposited to form the lid.

Using RIE to define microvias, a photopatterned etch is effected that leaves small holes (<1 μm) in the lid.

Figure 27:
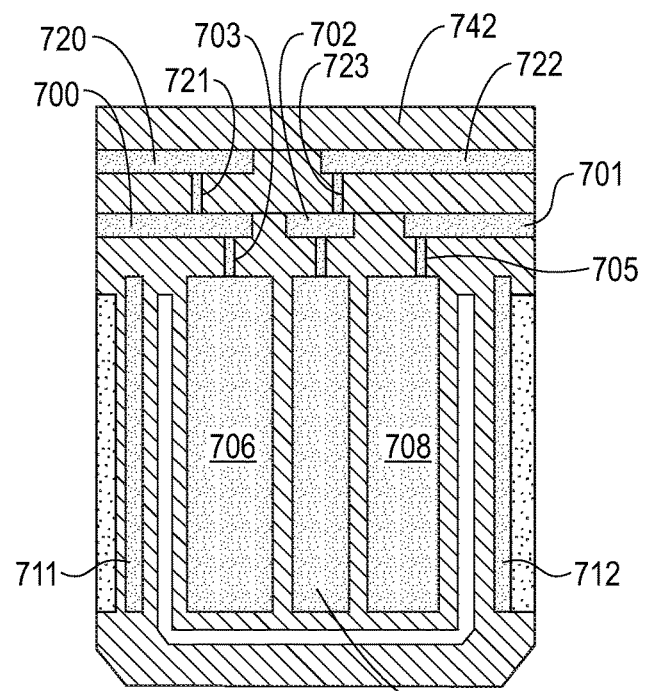
FIG. 27 shows a side view of the finished MEMS structure released from the handler.

The silicon in the cavity is etched with $XeF_2$. The cavity is the entire region bounded by the oxides deposited at the very beginning to form a ring wall, minus the pillar itself which is also made of oxide. $XeF_2$ will dissolve any silicon it contacts so only the microvias are left exposed, the $XeF_2$ etches all of the exposed Si bounded by the oxide walls. The microvias are closed with deposited oxide. The wafer is then released from the handler. The finished MEMS structure released from the handler is shown in FIG. 27.

Figure 28:
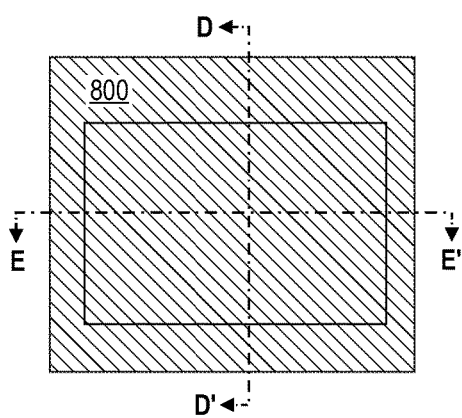
FIG. 28 is a top view of the finished MEMS switch 800.

FIG. 28 is a top view of the finished MEMS switch 800.

Figure 29:
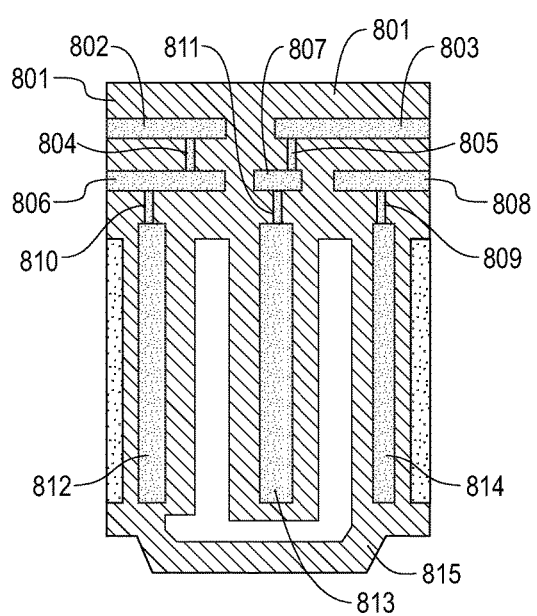
FIG. 29 is a cross sectional side view of the MEMS switch along the line E-E.

FIG. 29 is a cross sectional side view of the MEMS switch along the line D-D'. FIG. 29 shows deposited oxide layer 801 covering lines 802 and 803, vias 804 and 805 connected to lines 806 and 807 which are in turn connected to vias 810 and 811. Via 810 is connected to stationery electrode 812. Via 811 is connected to deflection electrode 813.

Via 809 is connected to drive electrode 814. Lid 815 provides sealed protection from external elements to ensure continued proper function.

Figure 30:
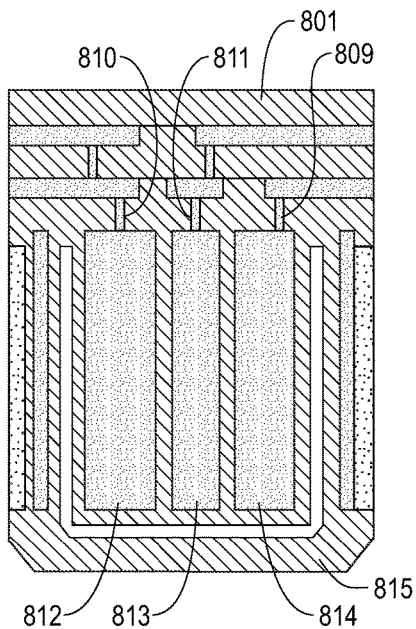
FIG. 30 is a cross sectional front view of the MEMS switch along the line F-F with deposited oxide layer covering lines and vias.

FIG. 30 is a cross sectional front view of the MEMS switch along the line E-E'. FIG. 30 shows the MEMS with deposited oxide layer 801 covering the lines and vias exactly as described above with respect to FIG. 29. Via 810 is connected to stationery electrode 812. Via 811 is connected to deflection electrode 813. Via 809 is connected to drive electrode 814. Lid 815 seals off the cavity to provide protection from external elements.

Figure 31:
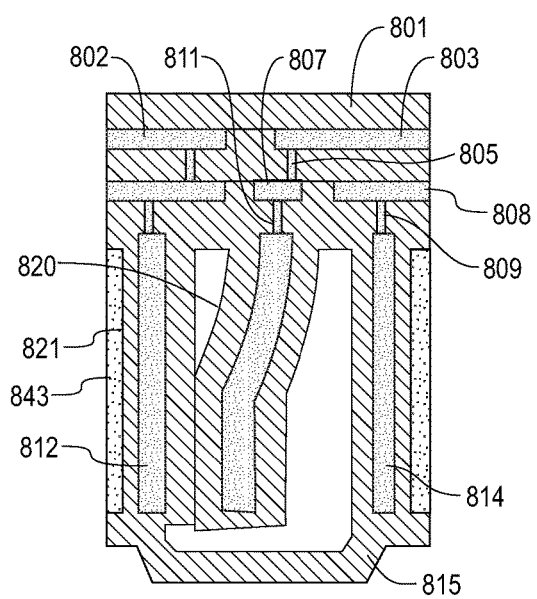
FIG. 31 depicts the MEMS switch depicted in FIGS. 29 and 30 which has been actuated.

FIG. 31 depicts the MEMS switch depicted in FIGS. 29 and 30 which has been actuated. In FIG. 31 a bias voltage, commonly referred to as the actuation voltage for MEMS switch has been applied to drive electrode 815. Electrode (beam) 813 bends left or right as a result of the A or B electrode directions detailed above.

The cantilevered beam structure 813, i.e. a beam that is the deflection electrode, has an electrically conductive outer layer deposited thereon which has been coated with an insulation material. Stationary flat electrode 812 is also coated with a conductive layer coated with an insulating material, which insulation material is contiguous, as shown, with wafer wall 843.

The stationary electrode and the drive electrode are each positioned adjacent to and in a plane parallel to the deflection electrode.

On each embodiment described herein a gap separates a contact point on the deflection electrode from a contact point on the stationary electrode. The contact point on the deflection electrode and said contact point on said stationary electrode are each covered with an insulation material.

In summary, this alternate embodiment starts with a solid wafer which is an embedded "box" so called due to its shape. An insulating oxide within surrounds a central pillar of W, and other elements of W located parallel to the pillar which are all embedded in a cavity that has been etched from the solid silicon box wafer. The wafer is ultimately capped with an oxide coating. The central pillar and the other two elements noted will form the deflection, stationary and drive electrodes.

As the result of etched, later, oxide and tungsten filled trenches, the sides and the "top" of the box are defined. A pillar protrudes within interior of the silicon wafer down from the oxide top formed by trenches interior to the box. The wafer is then flipped over and ground down through the silicon until the pillar is reached. At that point the box has the sides and the bottom (the wafer was flipped over) but is still filled with silicon.

A thin bump of silicon is applied over the top of the pillar and an oxide is deposited thereon. At this point in the process, the box has sides, bottom and top. Some small openings (microvias) are etched in the top of the box and $XeF_2$ is introduced, which etches out all of the silicon in the box, leaving the pillar standing in the cavity, attached at the current bottom of the box.

A small amount of oxide then deposited to plug the microvias. The completed switch possesses a cavity with the pillar and accompanying electrodes.

At the very end of the process when the dies are complete, a glass handler is removed from the silicon using laser ablation of the adhesive through the glass, followed by RIE, or by using solvent or ashing to remove the residual adhesive using CMP. High temperature ashing, or stripping, is performed to remove as much photo resist as possible, while the "descum" process is used to remove residual photo resist in trenches. The main difference between the two processes is the temperature the wafer is exposed to while in an ashing chamber.

The embodiment of the present invention described above comprises a MEMS, integrally coupled with a dual damascene structure thus forming a single unit. The tungsten fill in each of the several trenches etched out of the silicon component serves as a deflection, a stationary and a drive electrode.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic wafer, with leads that are affixed to a motherboard or other higher level wafer) or in a multichip package (such as a ceramic wafer that has either or both surface interconnections or buried interconnections).

In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present.

In contrast, when an element is described as being "directly connected" or "directly coupled" to another element, there are no intervening elements present.

When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What I claim and desire to protect by Letters Patent is:

1. The process for making a small wafer area MEMS switch comprising:
    a silicon wafer having an upper surface and a lower surface,
    on said upper surface of said silicon wafer, etching a plurality of separately aligned high aspect ratio closely spaced trenches in said upper surface using a DRIE etch;
    growing a lining of thermal oxide in each of said trenches such that each said trench is connected by said lining of thermal oxide wherein said thermal oxide surrounding each said trench blends together in the space between said trenches;
    connecting one or more of said trenches with said thermal oxide to form an outer group and enveloping a trench with said thermal oxide, forming an inner group;
    filling said trenches with CVD tungsten;
    depositing a dielectric layer on said upper silicon wafer surface covering an area between said inner group and said outer group that is not covered with said thermal oxide;
    etching a cavity up from said lower surface of and within said silicon wafer surface in vertical alignment with said inner group on said upper surface of said silicon wafer to leave said inner group as a free-standing beam cantilevered at said dielectric layer such that the combination of said free standing beam, said groups and said tungsten elements are adapted to form a MEMS electrical switch;
    applying a layer of an electrically conductive outer layer onto a seeded surface within said wafer to form at least one drive electrode, said drive electrode positioned adjacent to and in a plane parallel to said deflection electrode and said stationary electrode;
    providing a gap separating a contact point on said deflection electrode from a contact point on said stationary electrode, said contact point on said deflection electrode and said contact point on said stationary electrode each being covered with an insulation material;
    said deflection electrode being configured to be electrostatically attracted toward said drive electrode with a cantilevered motion, when said drive electrode is electrically biased, with the result that said insulated contact point on said conductive layer of said deflection electrode makes contact with said insulated contact point on said conductive layer of said stationary electrode.

2. The process for making small wafer area MEMS switch defined in claim 1 comprising:
    on said upper surface of said silicon wafer, etching three separately aligned high aspect ratio closely spaced trenches in a first row, in a second row and in a third row using a DRIE etch;
    growing a lining of thermal oxide in each of said trenches in said first row, said second row and said third row such that each said trench in said first row, said second row and said third row is connected by said lining of thermal oxide wherein said thermal oxide that surrounds each said trench blends together in the space between said trenches;
    said first row of trenches with said thermal oxide connecting same together and said third row of trenches with said thermal oxide connecting same together form an outer group;
    said second row of trenches with said thermal oxide, located between said first row of trenches and said third row of trenches forms an inner group;
    filling said trenches in said first row, said second row and said third row with CVD tungsten;
    depositing a dielectric layer on said upper silicon wafer surface covering an area between said inner group and said outer group that is not covered with said thermal oxide;
    etching a cavity up from said lower surface of and within said silicon wafer surface in vertical alignment with said inner group on said upper surface of said silicon wafer to leave said inner group as a free-standing beam cantilevered at said dielectric layer such that the combination of said free standing beam, said loop and said tungsten elements are adapted to form a MEMS electrical switch;
    applying a layer of an electrically conductive outer layer onto a seeded surface within said wafer to form at least one drive electrode, said drive electrode positioned adjacent to and in a plane parallel to said deflection electrode and said stationary electrode;
    providing a gap separating a contact point on said deflection electrode from a contact point on said stationary electrode, said contact point on said deflection electrode and said contact point on said stationary electrode each being covered with an insulation material;

said deflection electrode being configured to be electrostatically attracted toward said drive electrode with a cantilevered motion, when said drive electrode is electrically biased, with the result that said insulated contact point on said conductive layer of said deflection electrode makes contact with said insulated contact point on said conductive layer of said stationary electrode.

3. The process for making small wafer area MEMS switch defined in claim 2 wherein an interconnect wiring system is formed within said wafer comprising the following dual damascene steps:

using CVD or TEOS depositing an oxide that is the dielectric surrounding the wires;
applying a photoresist, then photopatterning for the trenches for the wires;
RIE said trenches, then clear said resist;
applying a photoresist, then photopatterning for vias for wiring to a layer below;
RIE vias clear the resist;
applying a Ta/TaN blanket film seed plus sputtered Cu seed;
electroplating blanket copper to overfill said trenches;
CMP copper to remove all copper not in etched regions;
RIE to remove Ta/TaN seed where not covered by Cu;
cap with SiN or SiCOH blanket.

4. The process for making the small wafer area MEMS switch defined in claim 3 wherein said blanket seed film is 100 Å to about 1000 Å blanket seed film and 500 Å to about 1000 Å sputtered copper, and said cap has a thickness of between about 100 Å and 1000 Å.

5. The process for making a MEMS switch defined in claim 3 wherein a $XeF_2$ is used to remove polysilicon in said cavity leaving the seed layer free standing where is contacts said dielectric oxide layer.

6. The process for making a MEMS switch defined in claim 3 wherein said dielectric oxide layer is a compound selected from the group consisting of $SiO_2$, $Si_3N_4$ and $Si_xN_y$.

7. The process for making small wafer area MEMS switch defined in claim 2 wherein an interconnect wiring system is formed within said wafer comprising single damascene steps comprising:

depositing a dielectric layer,
etching a trench;
depositing a barrier liner layer on said etched trenches;
depositing a seed layer on said barrier liner layer;
electroplating a copper fill layer on said feed layer;
CMP copper to remove excess copper not in etched regions;
remove Ta/TaN seed issuing RIE where not covered by copper;
cap with SiN or SiCOH blanket.

8. A process for making a small wafer area MEMS switch comprising:

etching a cavity in a silicon wafer using a DRIE etch to form an interior cavity having a surrounding side wall surface a top and a bottom, and forming within said cavity a freestanding pillar which is a cantilevered beam structure attached at said bottom of said cavity;
depositing and growing on said surface and said contained structure a dielectric oxide layer;
depositing and substantially filling said cavity with polysilicon, to substantially obtain a flat surface at said top of said cavity;
applying photopatterning with photoresist and RIE, etching a plurality of trenches in said deposited polysilicon, said trenches to be used for wiring connections to said MEMS switch;
removing said silicon with DRIE;
removing said photoresist;
depositing a blanket seed layer;
using a wet etch process, remove polysilicon in said cavity leave the seed layer free standing where it contacts said dielectric oxide layer;
electroplate an electrically conductive metal on said blanket seed layer wherein said cantilevered beam structure and conducting elements form a deflection electrode, stationary electrode and drive electrode respectively, each having a conductive layer thereon;
CMP said metal to remove a top surface of said metal not in said trenches;
blanket deposit an oxide or nitride insulator at diametrically opposite locations on said deflection electrode and said stationary electrode.

9. The process for making a MEMS switch defined in claim 8 wherein a contact gap is provided between said diametrically opposite locations on said deflection electrode and said stationary electrode, and an actuation gap is provided between said deflection electrode and said drive electrode.

* * * * *